(12) United States Patent
Kurashima et al.

(10) Patent No.: US 10,408,546 B2
(45) Date of Patent: Sep. 10, 2019

(54) LOOP HEAT PIPE

(71) Applicant: SHINKO ELECTRIC INDUSTRIES CO., LTD., Nagano (JP)

(72) Inventors: Nobuyuki Kurashima, Nagano (JP); Yoshihiro Machida, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 15/785,576

(22) Filed: Oct. 17, 2017

(65) Prior Publication Data
US 2018/0142960 A1 May 24, 2018

(30) Foreign Application Priority Data
Nov. 18, 2016 (JP) .................. 2016-225476

(51) Int. Cl.
| | | |
|---|---|---|
| *F28D 15/02* | (2006.01) | |
| *F28F 3/08* | (2006.01) | |
| *G06F 1/20* | (2006.01) | |
| *H01L 23/427* | (2006.01) | |
| *F28D 21/00* | (2006.01) | |

(52) U.S. Cl.
CPC ..... *F28D 15/0266* (2013.01); *F28D 15/0233* (2013.01); *F28F 3/08* (2013.01); *G06F 1/203* (2013.01); *H01L 23/427* (2013.01); *F28D 2021/0028* (2013.01)

(58) Field of Classification Search
CPC ............. F28D 15/0266; F28D 15/0233; F28D 2021/0028; F28F 3/08

USPC .......................................... 165/80.4, 104.21
See application file for complete search history.

(56) References Cited

U.S. PATENT DOCUMENTS

| | | | | |
|---|---|---|---|---|
| 8,191,616 B2* | 6/2012 | Behrens | ............... | B64C 1/40 165/168 |
| 8,611,089 B2* | 12/2013 | Mizuta | ............... | F28D 15/0233 165/104.21 |
| 8,913,386 B2* | 12/2014 | Gradinger | ............... | F28D 1/035 165/80.4 |
| 2009/0032226 A1* | 2/2009 | Huang | ............... | F28D 15/0266 165/104.26 |
| 2016/0259383 A1* | 9/2016 | Shioga | ............... | F28D 15/0266 |

FOREIGN PATENT DOCUMENTS

WO     2015/087451     6/2015

* cited by examiner

*Primary Examiner* — Raheena R Malik
(74) *Attorney, Agent, or Firm* — IPUSA, PLLC

(57) ABSTRACT

A loop heat pipe includes an evaporator that vaporizes working fluid; a condenser that condenses the working fluid; a liquid line that connects the evaporator and the condenser; and a vapor line that connects the evaporator and the condenser, wherein the evaporator, the vapor line, the liquid line and the condenser form a flow path that is a loop through which the working fluid or vapor of the working fluid flows, wherein in the condenser and the vapor line, a wall portion of the flow path is constituted by a metal layer, wherein a drain line formed to be separated and apart from the flow path is provided in the wall portion, and wherein a drawing line connecting the drain line and the flow path is provided in the wall portion.

12 Claims, 15 Drawing Sheets

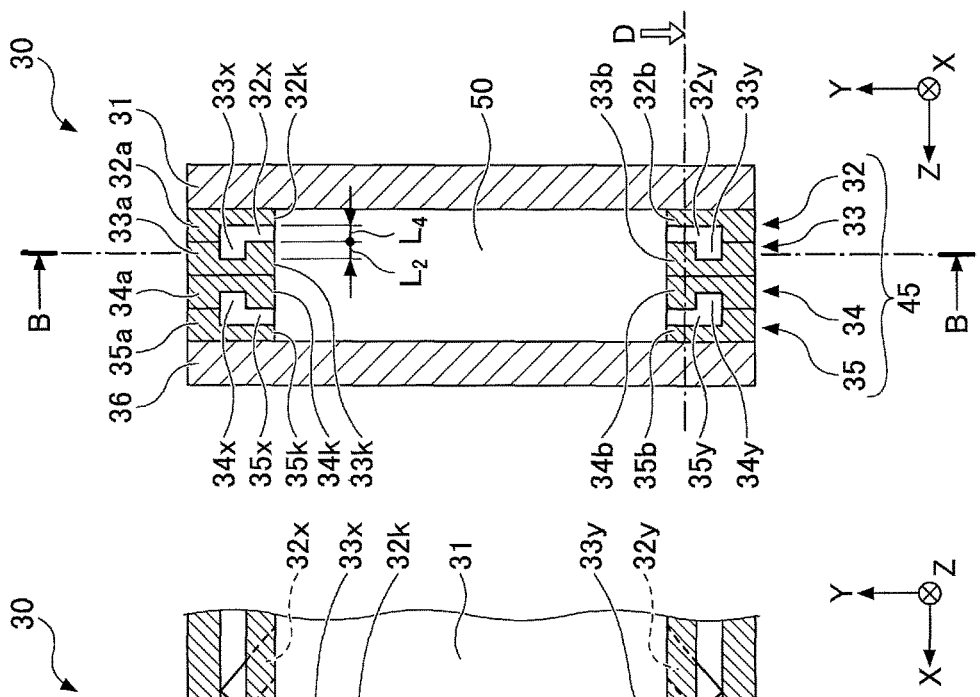
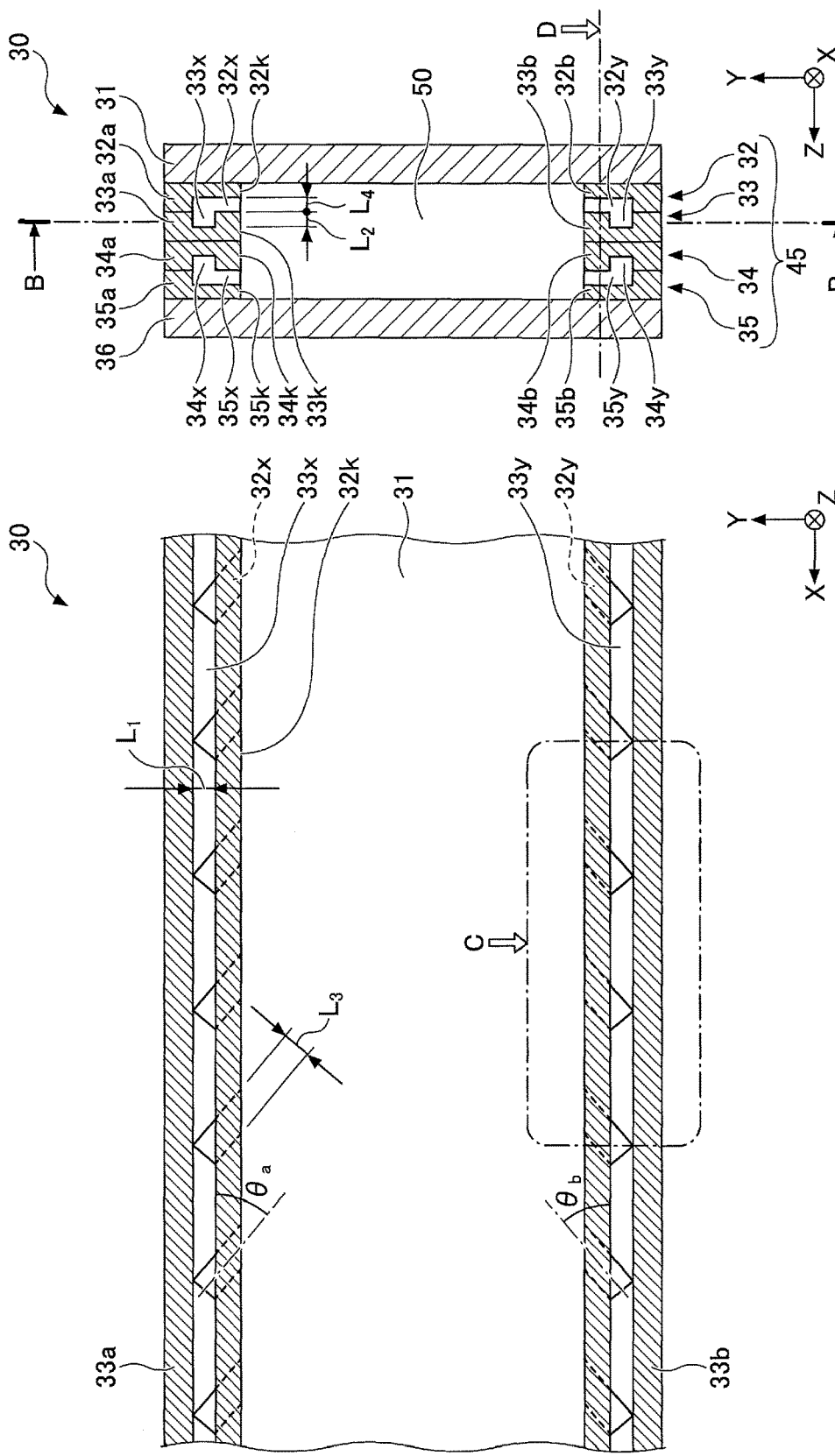

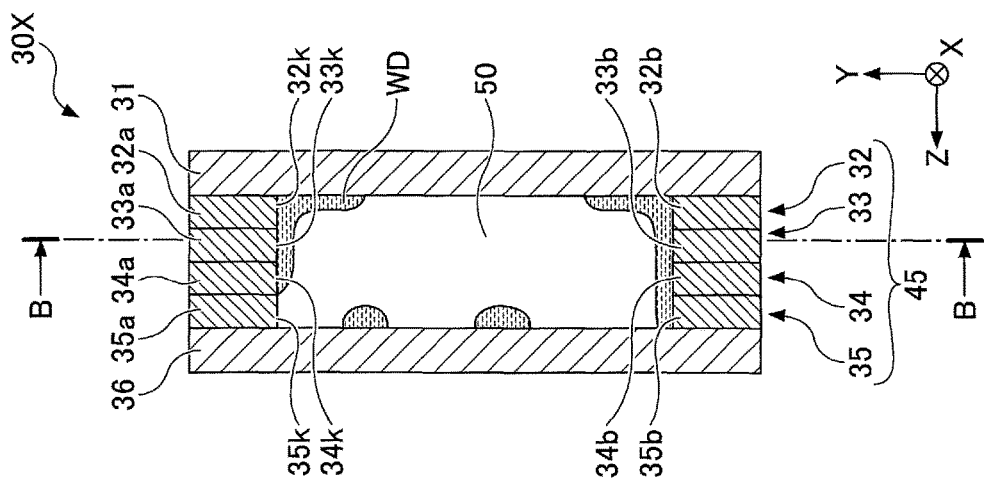
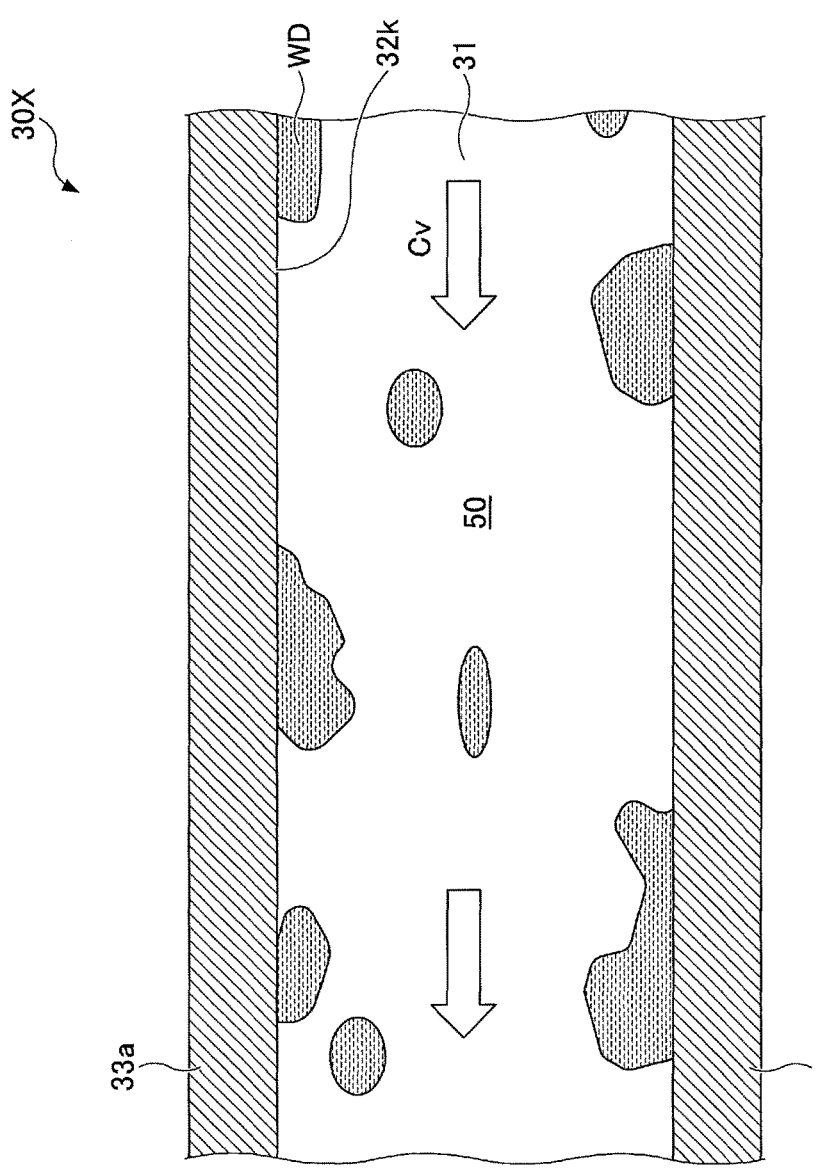

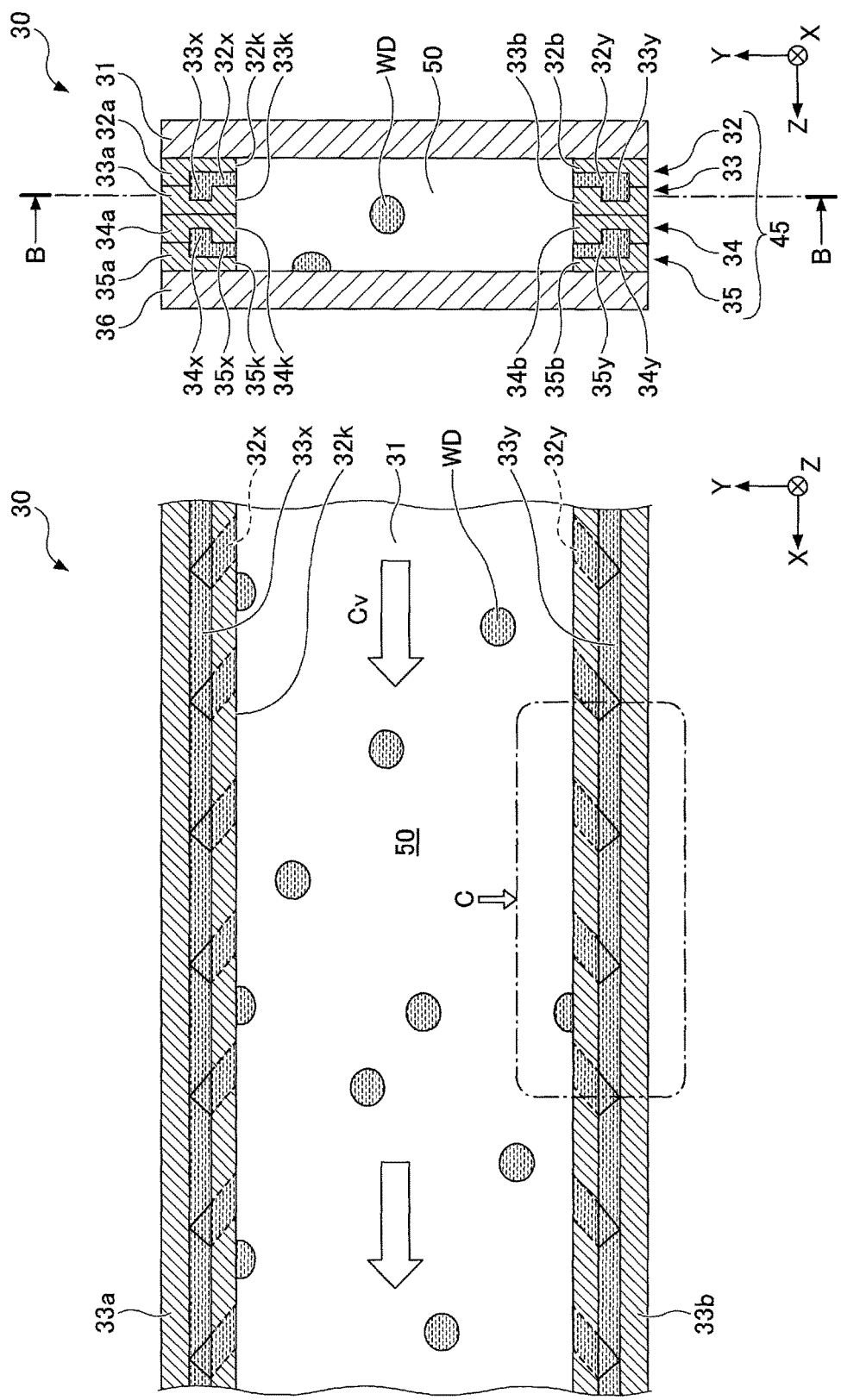

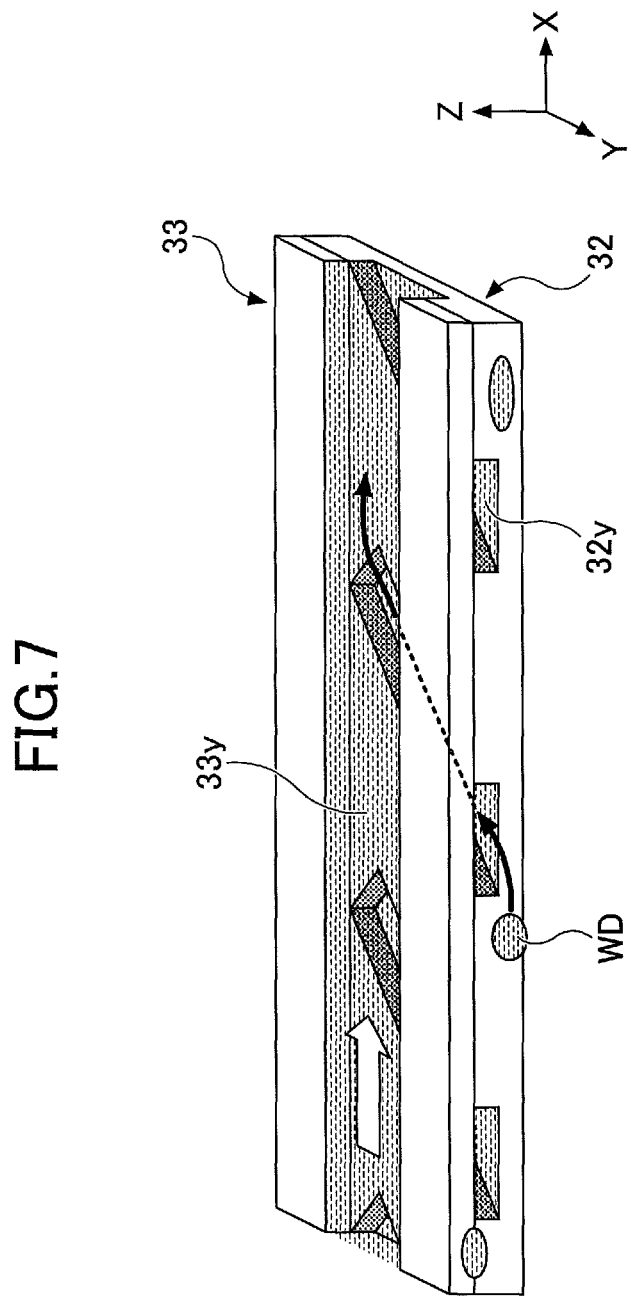

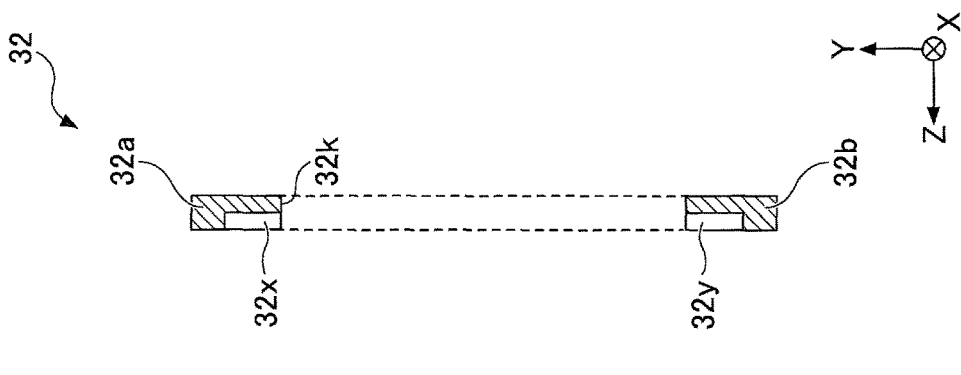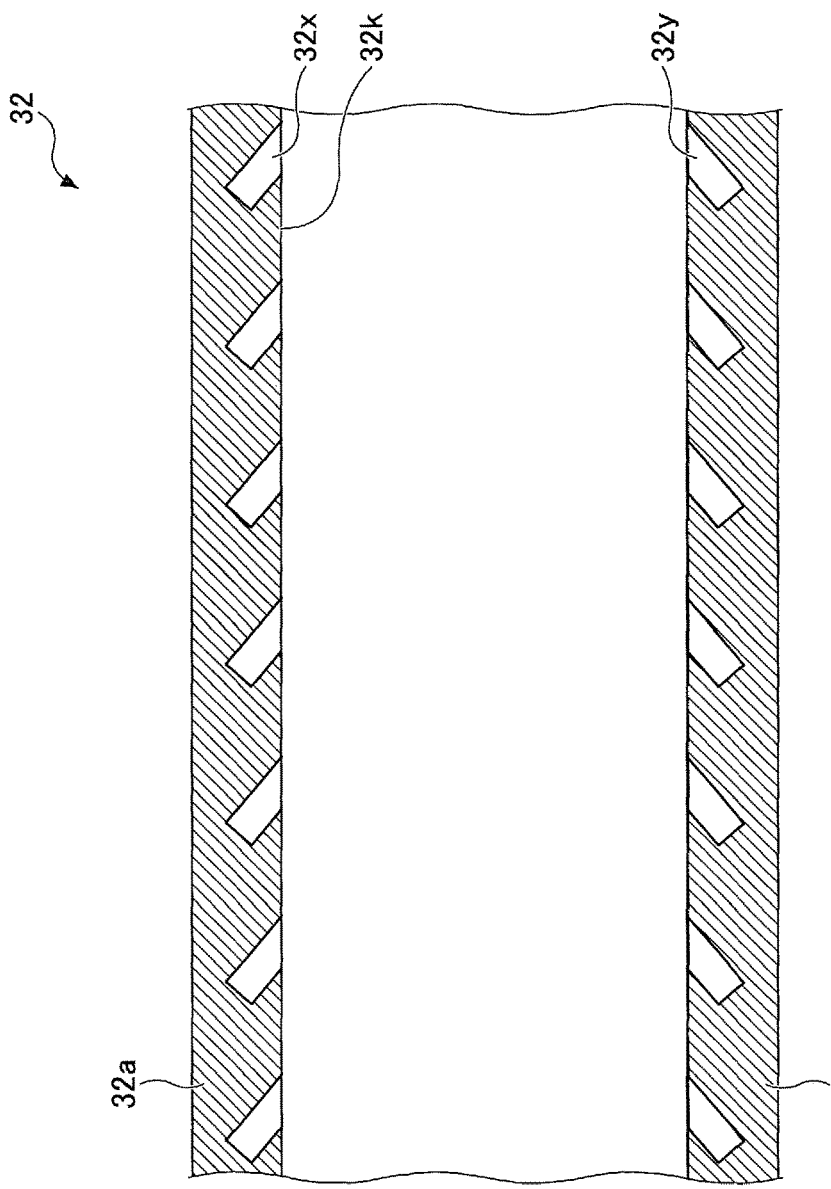

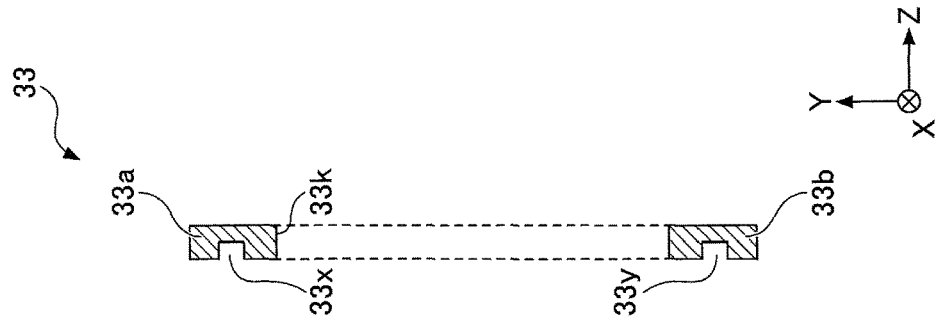
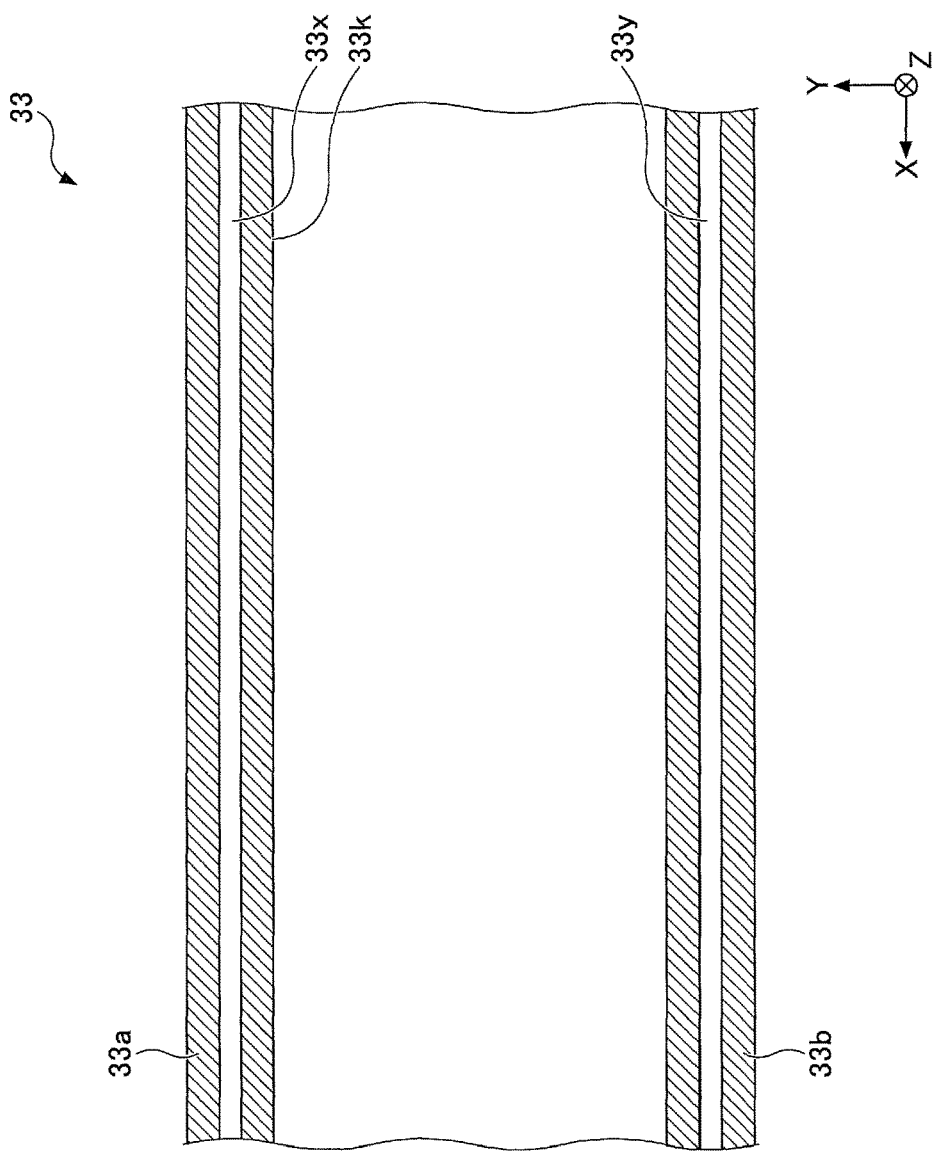

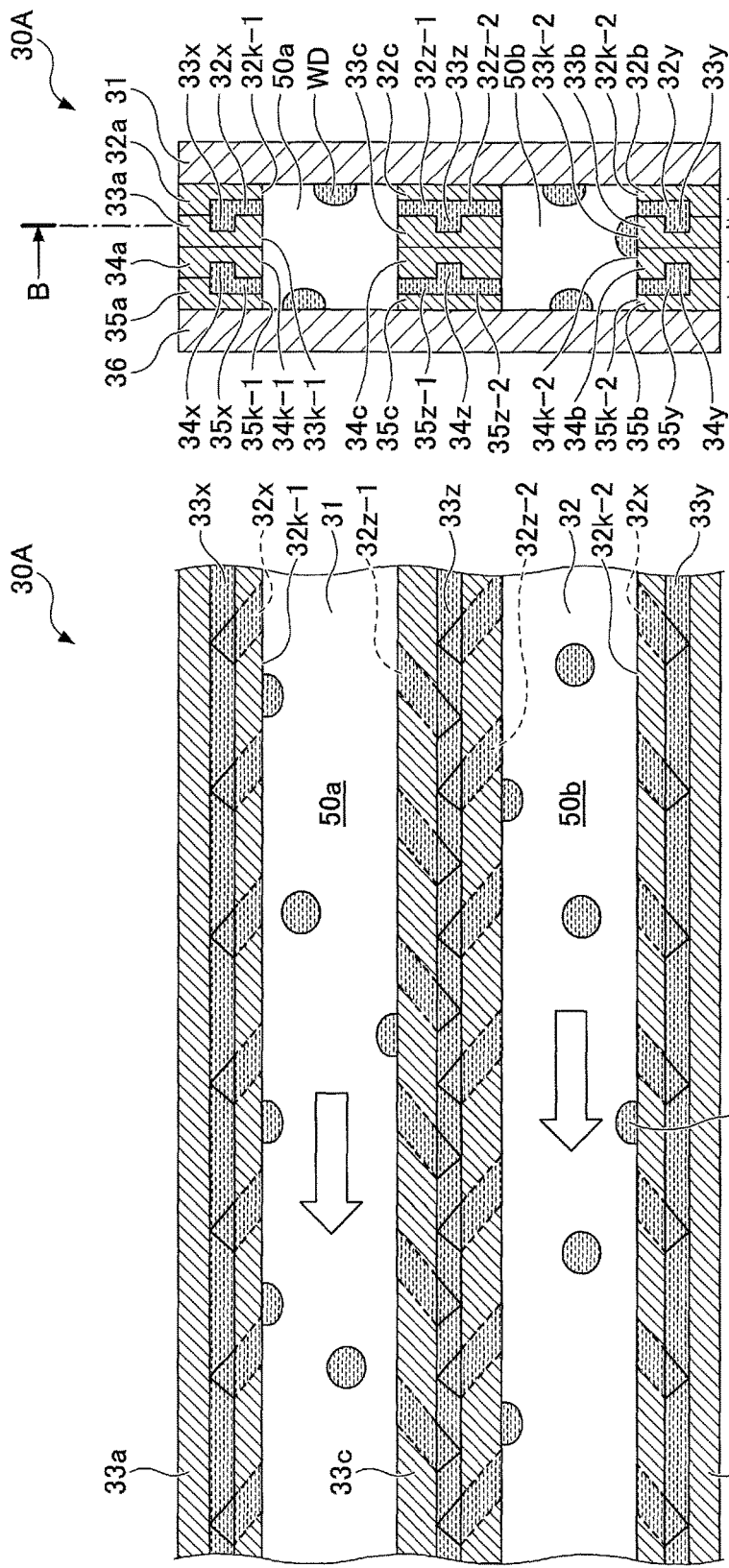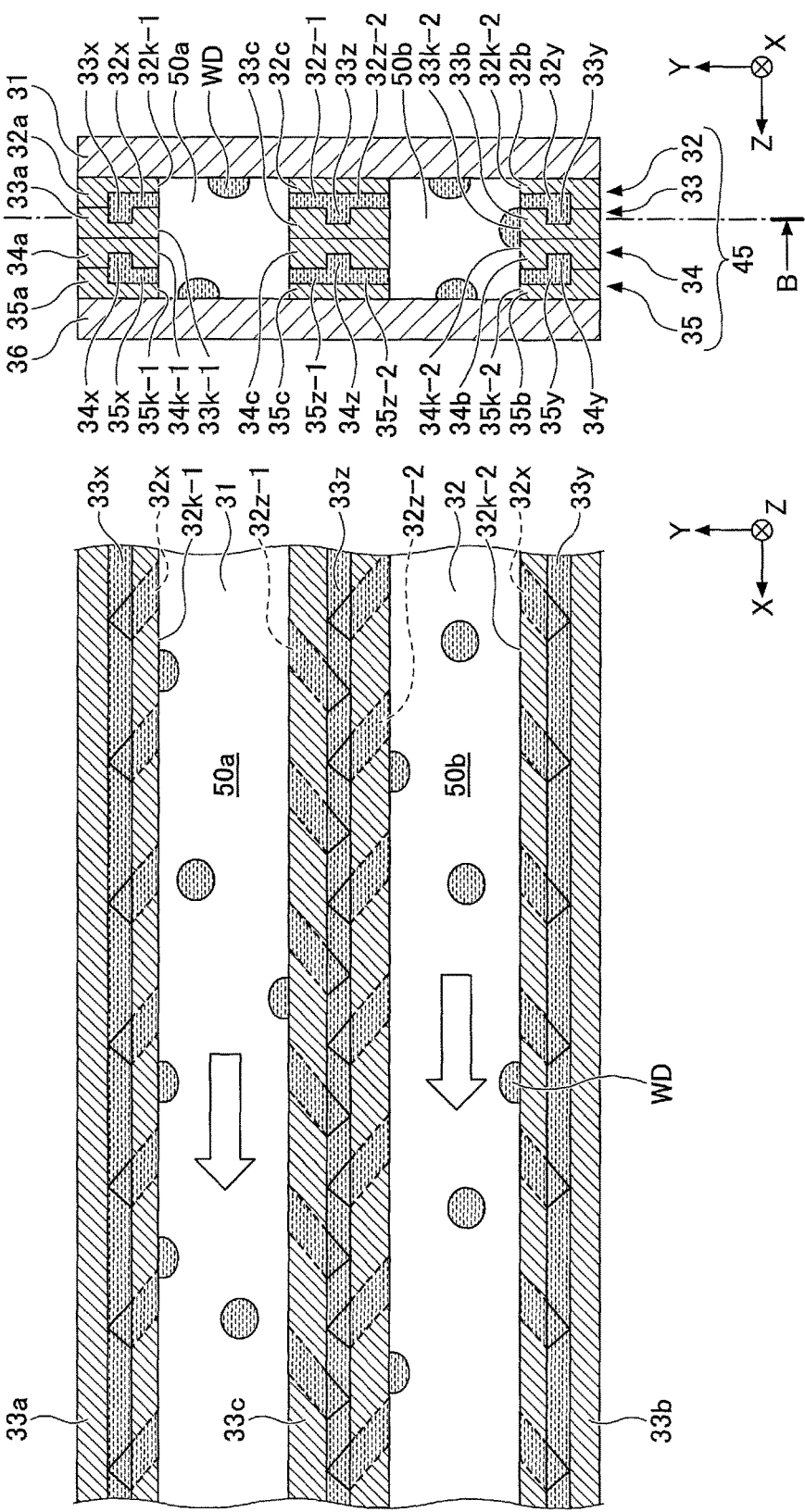

LOOP HEAT PIPE

CROSS-REFERENCE TO RELATED APPLICATIONS

The present application is based on and claims the benefit of priority of Japanese Priority Application No. 2016-225476 filed on Nov. 18, 2016, the entire contents of which are hereby incorporated by reference.

FIELD

The present invention relates to a loop heat pipe.

BACKGROUND

As a device to cool a heating component such as a Central Processing Unit (CPU) mounted on an electronic device, a heat pipe is known. The heat pipe is a device that transports heat using phase change of working fluid.

As an example of a heat pipe, a loop heat pipe includes an evaporator that vaporizes working fluid by heat of a heating component and a condenser that condenses the vaporized working fluid in which the evaporator and the condenser are connected by a liquid line and a vapor line that form a loop flow path. In the loop heat pipe, the working fluid flows in the loop flow path in one direction.

Further, a porous body is provided in the liquid line of the loop heat pipe so that the working fluid in the liquid line is induced to flow toward the evaporator by capillary force generated in the porous body and vapor is prevented from reversely flowing from the evaporator to the liquid line. A plurality of pores are formed in the porous body. Each of the pores is formed by stacking a plurality of metal layers in each of which through holes are formed such that the through holes of different metal layers partially overlap (see Patent Document 1, for example).

In the above described loop heat pipe, water heated at the evaporator becomes vapor and moves in the vapor line. However, a part of the vapor becomes a water drop by dew condensation while moving further from a heat source.

Such a condensed water drop cannot transfer heat. Further, there is a problem that, if such a condensed water drop exists in the vapor line, condensation of the vapor is promoted by contacting the water drop, in addition to lowering movement of the vapor. Further, if condensed water drops remain in the condenser, condensation of the vaporized working fluid is suppressed.

PATENT DOCUMENT

[Patent Document 1] WO 2015/087451

SUMMARY

The present invention is made in light of the above problems, and provides a loop heat pipe capable of suppressing dew condensation in a vapor line and promoting condensation in a condenser.

According to an embodiment, there is provided a loop heat pipe including an evaporator that vaporizes working fluid; a condenser that condenses the working fluid; a liquid line that connects the evaporator and the condenser; and a vapor line that connects the evaporator and the condenser, wherein the evaporator, the vapor line, the liquid line and the condenser form a flow path that is a loop through which the working fluid or vapor of the working fluid flows, wherein in the condenser and the vapor line, a wall portion of the flow path is constituted by a metal layer, wherein a drain line formed to be separated and apart from the flow path is provided in the wall portion, and wherein a drawing line connecting the drain line and the flow path is provided in the wall portion.

BRIEF DESCRIPTION OF DRAWINGS

Other objects, features and advantages of the present invention will become more apparent from the following detailed description when read in conjunction with the accompanying drawings.

FIG. 3A and FIG. 3B are cross-sectional views illustrating an example of a structure of a vapor line of the loop heat pipe of the first embodiment;

FIG. 5A and FIG. 5B are cross-sectional views illustrating an example of a structure of a vapor line of a loop heat pipe of a comparative example;

FIG. 6A and FIG. 6B are cross-sectional views for describing an effect of providing a drawing line and a drain line in the vapor line of the first embodiment;

FIG. 7 is a partial perspective view for describing an effect of providing the drawing line and the drain line in the vapor line of the first embodiment;

FIG. 8A and FIG. 8B are views (No. 1) illustrating an example of manufacturing steps of the loop heat pipe of the first embodiment;

FIG. 9A and FIG. 9B are views (No. 2) illustrating an example of the manufacturing steps of the loop heat pipe of the first embodiment;

FIG. 13A and FIG. 13B are cross-sectional views for describing an effect of providing a drawing line and a drain line in the vapor line of the second embodiment;

DESCRIPTION OF EMBODIMENTS

Figure 1:
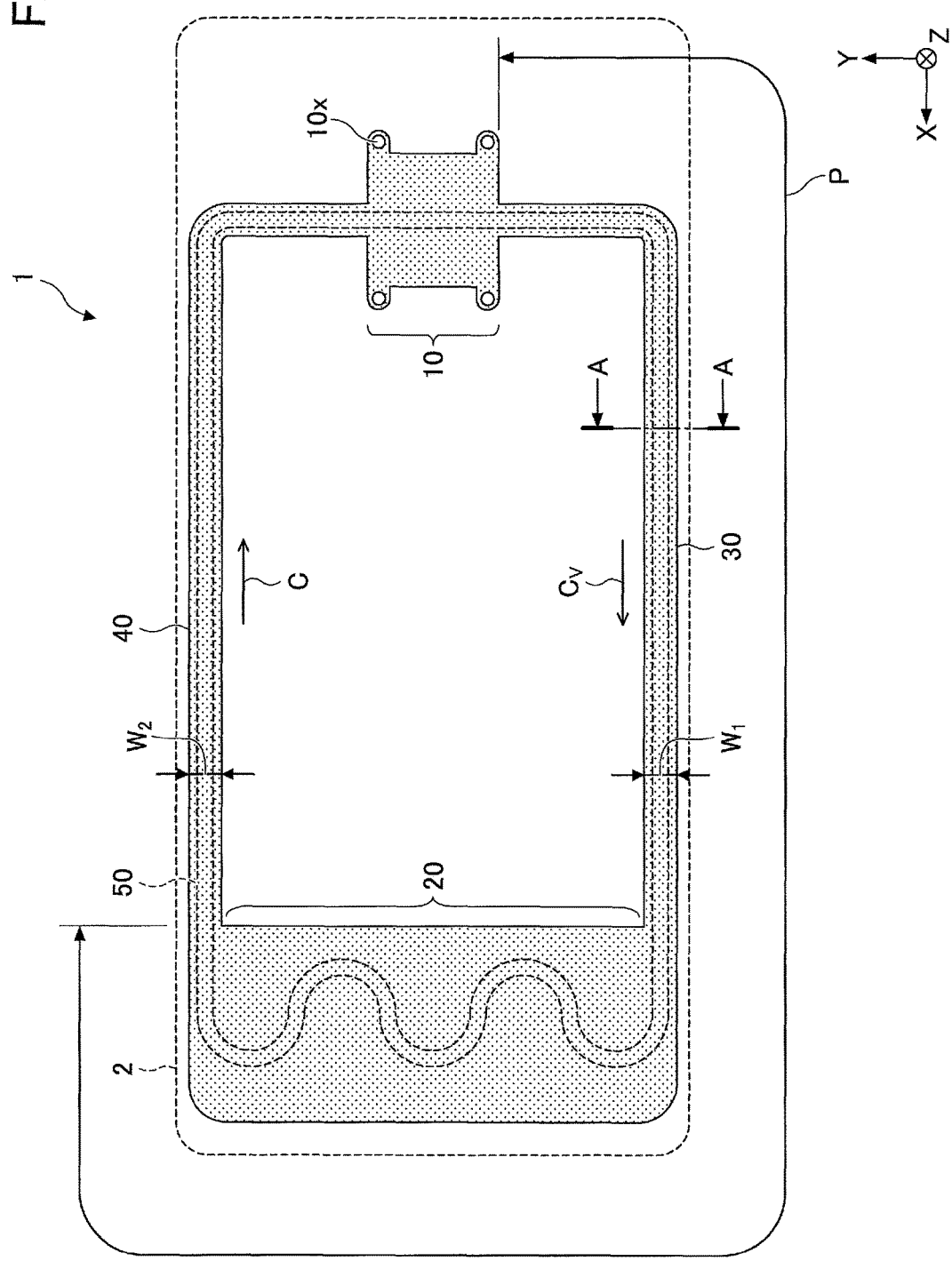
FIG. 1 is a plane view schematically illustrating an example of a loop heat pipe of a first embodiment.

The invention will be described herein with reference to illustrative embodiments. It is to be noted that, in the explanation of the drawings, the same components are given the same reference numerals, and explanations are not repeated.

First Embodiment (Structure of Loop Heat Pipe of First Embodiment)

First, a structure of a loop heat pipe of a first embodiment is described. FIG. 1 is a plane view schematically illustrating an example of a loop heat pipe 1 of the first embodiment.

With reference to FIG. 1, the loop heat pipe 1 includes an evaporator 10, a condenser 20, a vapor line 30 and a liquid line 40. The loop heat pipe 1 may be included in a mobile electronic device 2 such as, for example, a smartphone or a tablet terminal.

In the loop heat pipe 1, the evaporator 10 has a function to generate vapor Cv by vaporizing working fluid C. The condenser 20 has a function to condense (liquidize) the vapor Cv of the working fluid C. The evaporator 10 and the condenser 20 are connected by the vapor line 30 and the liquid line 40. A flow path 50, which is a loop, through which the working fluid C or the vapor Cv flows is formed by the vapor line 30, the condenser 20, the liquid line 40 and the evaporator 10.

Figure 2:
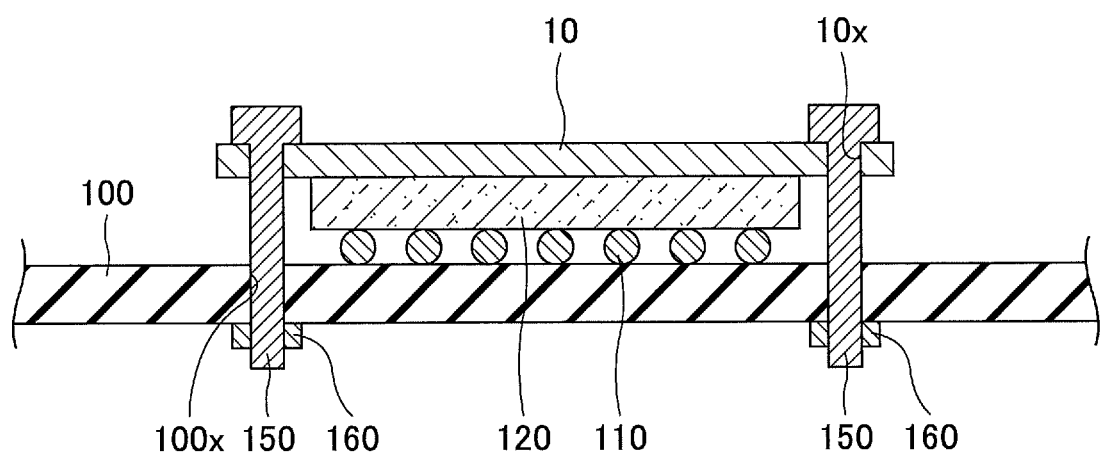
FIG. 2 is a cross-sectional view illustrating an evaporator and its surrounding of the loop heat pipe of the first embodiment.

FIG. 2 is a cross-sectional view illustrating the evaporator 10 and its surrounding of the loop heat pipe 1 of the first embodiment. As illustrated in FIG. 1 and FIG. 2, four through holes 10x, for example, are formed in the evaporator 10. The evaporator 10 is fixed to a circuit board 100 by inserting bolts 150 in the through holes 10x formed in the evaporator 10 and through holes 100x formed in the circuit board 100, and fixing by nuts 160 from a lower surface of the circuit board 100, respectively.

A heating component 120 such as a CPU, for example, is mounted on the circuit board 100 via bumps 110, and an upper surface of the heating component 120 closely contacts a lower surface of the evaporator 10. The working fluid C in the evaporator 10 is vaporized by heat generated at the heating component 120, and the vapor Cv is generated.

As illustrated in FIG. 1, the vapor Cv generated in the evaporator 10 is led to the condenser 20 via the vapor line 30 and is condensed (liquidized) at the condenser 20. With this, the heat generated at the heating component 120 moves to the condenser 20, and rise of temperature at the heating component 120 is suppressed. The working fluid C condensed at the condenser 20 is led to the evaporator 10 via the liquid line 40. The width $W_1$ of the vapor line 30 may be, for example, approximately 8 mm. The width $W_2$ of the liquid line 40 may be, for example, approximately 6 mm.

Although the type of the working fluid C is not specifically limited, in order to efficiently cool the heating component 120 by latent heat of vaporization, it is preferable to use fluid whose vapor pressure is high as well as whose latent heat of vaporization is large. For such fluid, for example, ammonia, water, fluorocarbon, alcohol and acetone may be raised.

The evaporator 10, the condenser 20, the vapor line 30 and the liquid line 40 may be, for example, a structure in which a plurality of metal layers are stacked. The metal layers are, for example, copper layers having good thermal conductivity, and directly bonded by solid-phase welding or the like. The thickness of each of the metal layers may be, for example, approximately 50 μm to 200 μm.

The metal layers are not limited to the copper layers, and may be stainless layers, aluminum layers, magnesium alloy layers or the like. The number of the stacked metal layers is not specifically limited.

Figure 4A:
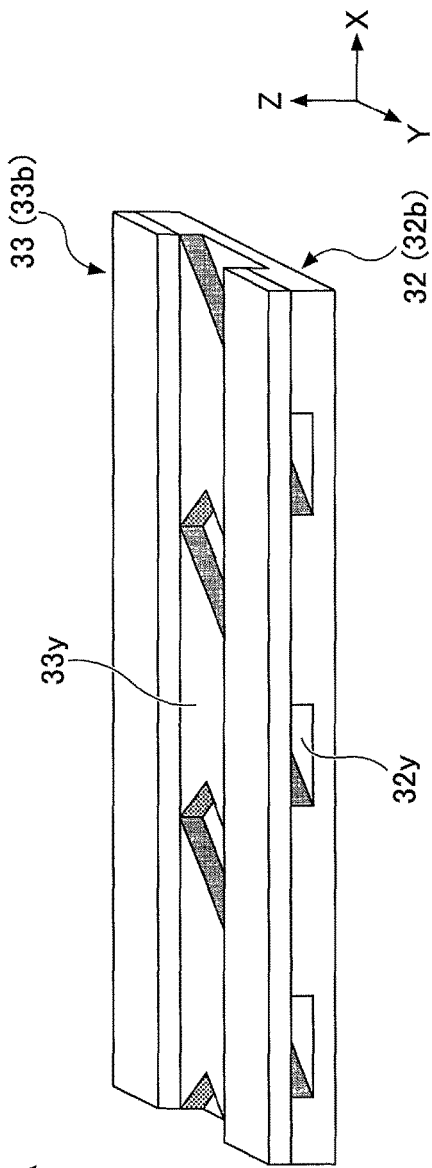
FIG. 4A and FIG. 4B are partial perspective views illustrating an example of a structure of the vapor line of the loop heat pipe of the first embodiment.
Figure 4B:
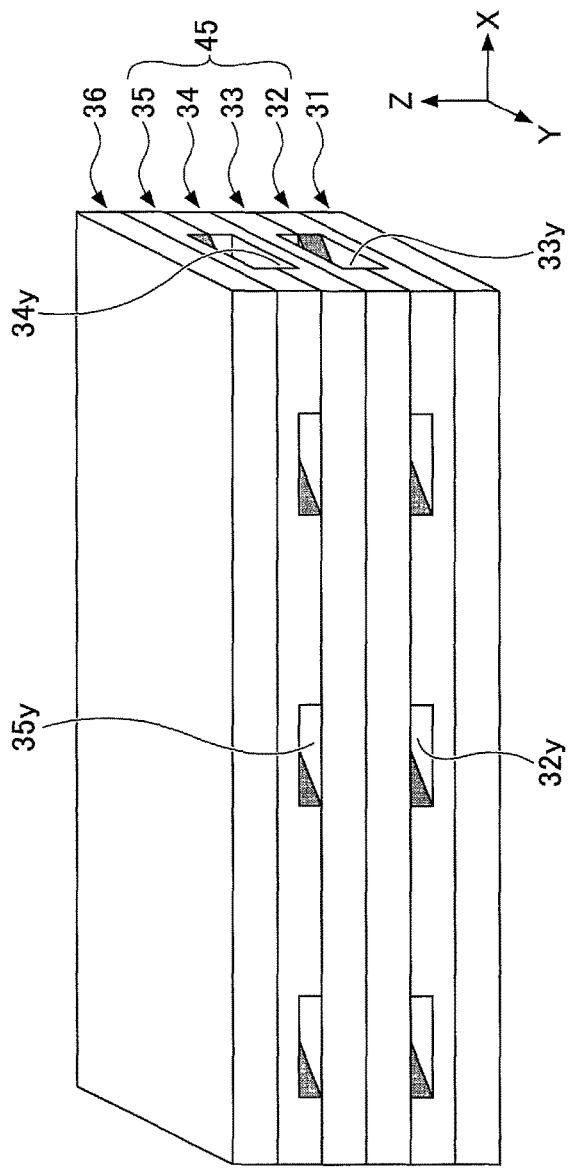

FIG. 3A and FIG. 3B are cross-sectional views illustrating an example of a structure of the vapor line 30 of the loop heat pipe 1 of the first embodiment. FIG. 3B illustrates a cross-section along an A-A line of FIG. 1. FIG. 3A illustrates a cross-section along a B-B line of FIG. 3B. FIG. 4A and FIG. 4B are perspective views partially illustrating an example of a structure of the vapor line 30 of the loop heat pipe 1 of the first embodiment. FIG. 4A is a partial perspective view illustrating a portion of FIG. 3A surrounded by a dashed line seen in a direction of an arrow C, and FIG. 4B is a partial perspective view illustrating a portion of FIG. 3B seen in a direction of an arrow D. In FIG. 3A to FIG. 4B, a stacking direction of the metal layers 31 to 36 is a Z direction, a flowing direction of the vapor Cv in the vapor line 30 (flow path 50) is an X direction, and a direction that is perpendicular to the X direction and the Z direction is a Y direction (This is the same for following drawings.).

As illustrated in FIG. 3A to FIG. 4B, the vapor line 30 may be a structure in which, for example, six layers of metal layers 31, 32, 33, 34, 35 and 36 are stacked in this order. Here, the number of the stacked metal layers is not limited, and at least three of the metal layers may be stacked.

The metal layers 31 to 36 are, for example, copper layers having good thermal conductivity, and directly bonded by solid-phase welding or the like. The thickness of each of the metal layers 31 to 36 may be, for example, approximately 50 μm to 200 μm. The metal layers 31 to 36 are not limited to the copper layers, and may be stainless layers, aluminum layers, magnesium alloy layers or the like.

The metal layers 31 and 36 are outermost metal layers that are positioned at both outsides of the stacked body of the metal layers 31 to 36, and form part of outer walls of the vapor line 30. Each of the metal layers 31 and 36 is a solid metal layer in which pores and grooves are not formed. The metal layers 32 to 35 are an intermediate metal layer 45 sandwiched between the outermost metal layers 31 and 36. The intermediate metal layer 45 may include at least one metal layer.

The metal layer 32 includes a wall portion 32a and a wall portion 32b, each having a long and narrow shape, formed to be apart from each other and substantially in parallel with each other while interposing a predetermined opening 32k therebetween in the Y direction. The opening 32k is, for example, formed to expose a part of each of the metal layers 31 and 36 in the opening 32k.

Similarly, the metal layer 33 includes a wall portion 33a and a wall portion 33b, each having a long and narrow shape, formed to be apart from each other and substantially in parallel with each other while interposing a predetermined opening 33k therebetween in the Y direction. The wall portion 33a and the wall portion 33b are, for example, formed to stack on the wall portion 32a and the wall portion 32b, respectively. The opening 33k is, for example, formed to communicate with the opening 32k and expose the part of each of the metal layers 31 and 36 in the opening 33k.

Similarly, the metal layer 34 includes a wall portion 34a and a wall portion 34b, each having a long and narrow shape, formed to be apart from each other and substantially in parallel with each other while interposing a predetermined opening 34k therebetween in the Y direction. The wall portion 34a and the wall portion 34b are, for example, formed to stack on the wall portion 33a and the wall portion 33b, respectively. The opening 34k is, for example, formed to communicate with the opening 33k and expose the part of each of the metal layers 31 and 36 in the opening 34k.

Similarly, the metal layer 35 includes a wall portion 35a and a wall portion 35b, each having a long and narrow shape, formed to be apart from each other and substantially in parallel with each other while interposing a predetermined opening 35k in the Y direction. The wall portion 35a and the wall portion 35b are, for example, formed to stack on the wall portion 34a and the wall portion 34b, respectively. The opening 35k is, for example, formed to expose a part of each of the metal layers 31 and 36 in the opening 35k. Further, the opening 35k is, for example, formed to communicate with the opening 34k. Thus, the openings 32k to 35k expose the part of each of the metal layers 31 and 36 in the openings 32k to 35k.

The flow path 50 through which the vapor Cv flows is formed by the openings 32k to 35k provided in the metal layers 32 to 35, respectively, and by the metal layers 31 and 36.

The wall portions 32a to 35a and the wall portions 32b to 35b of the metal layers 32 to 35, respectively, constitute a part of the outer walls of the vapor line 30.

As can be particularly understood from FIG. 3A and FIG. 4A, drain lines 33x and 33y each extends along the flow path 50, in other words, in the X direction or in the flowing direction of the vapor Cv, are provided in the wall portions 33a and 33b of the metal layer 33, respectively. Each of the drain lines 33x and 33y is not directly communicating with the flow path 50 and is separated and apart from (independently from) the flow path 50. In other words, a part of the wall portions 33a and 33b separate the drain lines 33x and 33y from the flow path 50, respectively.

Similarly, drain lines 34x and 34y each extends along the flow path 50, in other words, in the X direction or in the flowing direction of the vapor Cv, are provided in the wall portions 34a and 34b of the metal layer 34, respectively. Each of the drain lines 34x and 34y is not directly communicating with the flow path 50 and is separated and apart from (independently from) the flow path 50. In other words, a part of the wall portions 34a and 34b separate the drain lines 34x and 34y from the flow path 50, respectively.

As can be particularly understood from FIG. 3A and FIG. 4A, drawing lines (i.e., drawing conduits) 32x and 32y are provided in the wall portions 32a and 32b of the metal layer 32 for connecting the drain lines 33x and 33y with the flow path 50, respectively. Similarly, drawing lines (i.e., drawing conduits) 35x and 35y are provided in the wall portions 35a and 35b of the metal layer 35 for connecting the drain lines 34x and 34y with the flow path 50, respectively.

As can be particularly understood from FIGS. 3B and 4B, the drain line 33x is formed by a concave portion that is half-etched along the X direction of the flow path 50 in the wall portion 33a of the metal layer 33. The drain line 33x is separated and apart from the flow path 50 by a sidewall of the concave portion. Similarly, the drain line 33y is formed by a concave portion that is half-etched along the X direction of the flow path 50 in the wall portion 33b of the metal layer 33. The drain line 33y is separated and apart from the flow path 50 by a sidewall of the concave portion.

Similarly, the drain line 34x is formed by a concave portion that is half-etched along the X direction of the flow path 50 in the wall portion 34a of the metal layer 34. The drain line 34x is separated and apart from the flow path 50 by a sidewall of the concave portion. Similarly, the concave drain line 34y is formed by a concave portion that is half-etched along the X direction of the flow path 50 in the wall portion 34b of the metal layer 34. The drain line 34y is separated and apart from the flow path 50 by a sidewall of the concave portion. As the metal layer 34 has a structure similar to that of the metal layer 33, an enlarged view of the metal layer 34 is not illustrated in the drawings.

The drawing lines 32x are formed by concave portions that are half-etched in the wall portion 32a of the metal layer 32 at a predetermined interval along the X direction of the drain line 33x. Similarly, the drawing lines 32y are formed by concave portions that are half-etched in the wall portion 32b of the metal layer 32 at a predetermined interval along the X direction of the drain line 33y.

Similarly, the drawing lines 35x are formed by concave portions that are half-etched in the wall portion 35a of the metal layer 35 at a predetermined interval along the X direction of the drain line 34x. The drawing lines 35y are formed by concave portions that are half-etched in the wall portion 35b of the metal layer 35 at a predetermined interval along the X direction of the drain line 34y. As the metal layer 35 has a structure similar to that of the metal layer 32, an enlarged view of the metal layer 35 is not illustrated in the drawings.

With reference to FIG. 3A, the width $L_1$ of the drain line 33x in the Y direction may be, for example, approximately 0.2 to 0.4 mm. With reference to FIG. 3B, the depth $L_2$ of the drain line 33x in the Z direction may be, for example, approximately 0.2 to 0.4 mm. For each of the drain lines 33y, 34x and 34y, the width or the depth of a portion corresponding to each of the width $L_1$ and the depth $L_2$ of the drain line 33x may be approximately the same as that of each of the width $L_1$ and the depth $L_2$ of the drain line 33x.

With reference to FIG. 3A, each of the drawing lines 32x is provided to be inclined with respect to the drain line 33x, and an angle θa between the drawing line 32x and the drain line 33x in the flowing direction of the vapor Cv may be, for example, a sharp angle, approximately 45°. Similarly, each of the drawing lines 32y is provided to be inclined with respect to the drain line 33y, and an angle θb between the drawing line 32y and the drain line 33y in the flowing direction of the vapor Cv may be, for example, a sharp angle, approximately 45°. Here, the angle θa and the angle θb are not necessarily the same angle. An angle between the drawing line 35x and the drain line 34x, and an angle between the drawing line 35y and the drain line 34y may be approximately the same as the angles θa and θb, respectively.

The width $L_3$ of the drawing line 32x in a direction perpendicular to the inclined direction may be, for example, approximately 0.2 to 0.4 mm. With reference to FIG. 3B, the depth $L_4$ of the drawing line 32x in the Z direction may be, for example, approximately 0.2 to 0.4 mm. For each of the drawing lines 32y, 35x and 35y, the width or the depth of a portion corresponding to each of the width $L_3$ and the depth $L_4$ of the drawing line 32x may be approximately the same as that of each of the width $L_3$ and the depth $L_4$ of the drawing line 32x.

By stacking the metal layer 32 and the metal layer 33, one end of each of the drawing lines 32x communicates with the drain line 33x, and the other end of each of the drawing lines 32x communicates with the flow path 50. Similarly, one end of each of the drawing lines 32y communicates with the drain line 33y, and the other end of each of the drawing lines 32y communicates with the flow path 50.

Similarly, by stacking the metal layer 34 and the metal layer 35, one end of each of the drawing lines 35x communicates with the drain line 34x, and the other end of each of the drawing lines 35x communicates with the flow path 50. Similarly, one end of each of the drawing lines 35y communicates with the drain line 34y, and the other end of each of the drawing lines 35y communicates with the flow path 50.

As such, the intermediate metal layer 45, constituted by the metal layers 32 to 35, includes a stacked body configured by stacking at least two metal layers (for example, the metal layer 32 and the metal layer 33). In other words, the intermediate metal layer 45 includes a stacked body configured by stacking a metal layer in which the drain line is formed and a metal layer in which the drawing lines are formed. In FIG. 3B and FIG. 4B, two staked bodies (a stacked body configured by the metal layer 32 and metal layer 33, and a stacked body configured by the metal layer 34 and the metal layer 35) are stacked. If the drain line and the drawing lines are provided in a same single metal layer, intensity of the metal layer is lowered. However, by using two metal layers, and forming the drain line in one of the metal layers and forming the drawing lines in the other of the metal layers, sufficient intensity can be retained.

Here, the structure of FIG. 3A to FIG. 4B is not only formed in the vapor line 30, but also formed in the condenser 20. In other words, the structure of FIG. 3A to FIG. 4B is continuously formed at a portion of the flow path 50 indicated by an arrow P in FIG. 1.

Here, an effect of the structure illustrated in FIG. 3A to FIG. 4B is described by comparing with a comparative example. FIG. 5A and FIG. 5B are cross-sectional views illustrating an example of a structure of a vapor line 30X of a loop heat pipe of the comparative example, and correspond to cross-sections of FIG. 3A and FIG. 3B, respectively.

The vapor line 30X illustrated in FIG. 5A and FIG. 5B is different from the vapor line 30 (see FIG. 3A to FIG. 4B) in that the drain lines and the drawing lines are not provided in the wall portions 32a to 35a and 32b to 35b of the metal layers 32 to 35, respectively.

In the comparative example, it is assumed that the vapor line 30X is provided in the loop heat pipe 1 instead of the vapor line 30 in FIG. 1, and the vapor Cv generated in the evaporator 10 moves in the vapor line 30X in a direction of an arrow (X direction) of FIG. 5A toward the condenser 20 and the liquid line 40. In such a case, the vapor Cv is dew condensed in the vapor line 30X to become a water drop WD, and the water drop WD stays in the flow path 50. The water drop WD is cooled and promotes further dew condensation of the vapor Cv to narrow the vapor line 30X so that the flow of the vapor Cv is worsened. With this, it is hard for the vapor Cv to smoothly move, and heat transfer efficiency is lowered.

On the other hand, according to the first embodiment, it is assumed that the vapor Cv generated in the evaporator 10 (FIG. 1) moves in the vapor line 30 in a direction of an arrow (X direction) of FIG. 6A toward the condenser 20 and the liquid line 40. Here, FIG. 6A and FIG. 6B are cross-sectional views for describing an effect of providing the drawing lines and the drain lines in the vapor line 30. FIG. 7 is a partial perspective view illustrating a portion of FIG. 6A surrounded by a dashed line seen in a direction of an arrow C.

As can be particularly understood from FIG. 6A and FIG. 7, even when the vapor Cv is dew condensed in the vapor line 30 and water drops WD are generated, the water drops WD are drawn to the drain line 33y via the drawing lines 32y by capillary attraction. Similarly, the water drops WD are drawn to the drain line 33x via the drawing lines 32x by capillary attraction. Similarly, the water drops WD are drawn to the drain lines 34x and 34y via the drawing lines 35x and 35y, respectively, by capillary attraction. As each of the drain lines 33x, 34x and 34y, and each of the drawing lines 32x, 35x and 35y has a structure similar to that of the drain line 33y and the drawing line 32y, respectively, an enlarged view of the drain lines 33x, 34x and 34y, and the drawing lines 32x, 35x and 35y are not illustrated in the drawings. Thus, the water drops WD hardly stay in the vapor line 30, and the water drops WD can be prevented from being formed into a large drop. As a result, as the water drops WD do not block the flow of the vapor Cv, the vapor Cv can easily move, heat transfer efficiency can be improved, and a radiation effect of the heating component 120 can be increased.

With reference to FIG. 7, the water drops WD generated by the dew condensation of the vapor Cv and drawn into the drain line 33y via the drawing lines 32y are moved in the X direction of the drain line 33y toward the liquid line 40. Similarly, the water drops WD drawn into the drain line 33x via the drawing lines 32x are moved in the X direction toward the liquid line 40. Similarly, the water drops WD drawn into the drain lines 34x and 34y via the drawing lines 35x and 35y, respectively, are moved in the X direction toward the liquid line 40. This means that the vapor Cv flows in the direction of the arrow (X direction) of FIG. 6A, and the water drops WD drawn into the drain lines 33x, 33y, 34x and 34y by the capillary attraction of the drain lines 33x, 33y, 34x and 34y, respectively, also flow in the direction of the arrow (X direction). Then, the water drops WD are circulated from the condenser 20 to the liquid line 40, and then to the evaporator 10. This means that, the drain lines 33x, 33y, 34x and 34y are connected to the liquid line 40 at an end of the portion of the flow path 50 indicated by the arrow P in FIG. 1 at a liquid line 40 side.

By setting an angle between each of the drawing lines and each of the drain lines, in the flowing direction of the vapor Cv, to be a sharp angle, resistance of the water drop WD at a portion where the drawing line and the respective drain line meet can be reduced. Thus, the water drops WD can be easily drawn into the drain lines. However, even when the angle between each of the drawing lines and each of the drain lines is a right angle, a certain effect can be obtained.

Further, by forming each of the drain lines not to be directly communicating with the flow path 50, compared with a case when each of the drain lines is formed to be directly communicating with the flow path 50, capillary attraction of the drain lines can be improved.

(Method of Manufacturing Loop Heat Pipe of First Embodiment)

Figure 10:
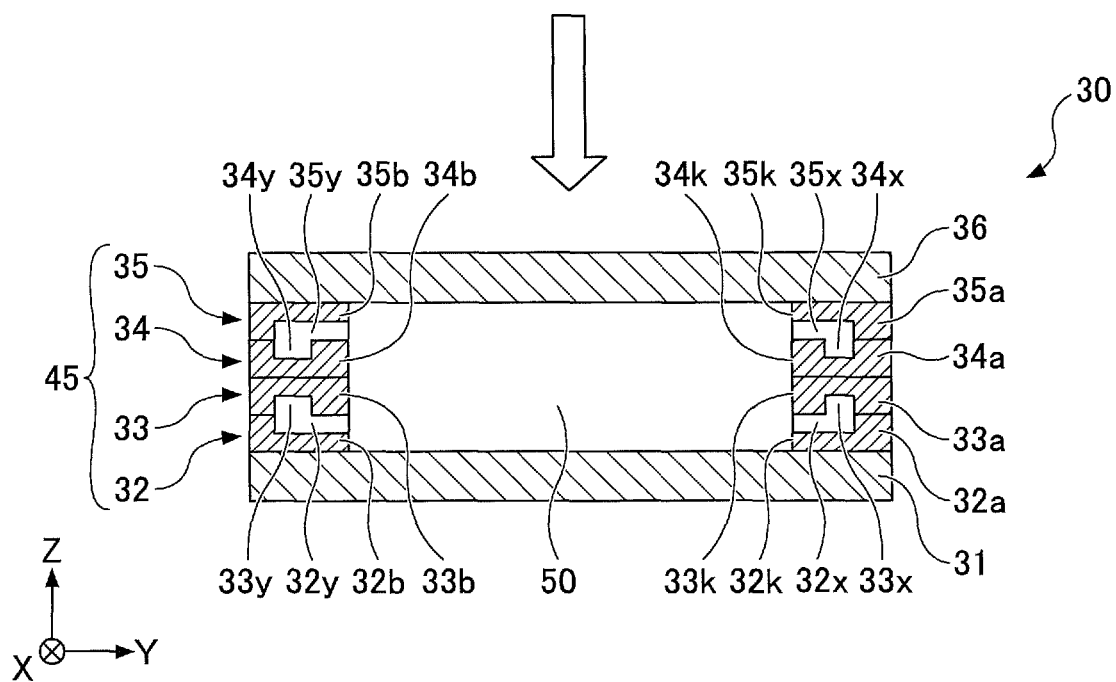
FIG. 10 is a view (No. 3) illustrating an example of the manufacturing steps of the loop heat pipe of the first embodiment.

Next, a method of manufacturing the loop heat pipe 1 of the first embodiment is described, in particularly, regarding manufacturing steps of the drain lines 33x, 33y, 34x and 34y and the drawing lines 32x, 32y, 35x and 35y of the vapor line 30. FIG. 8A to FIG. 10 are views for illustrating an example of the manufacturing steps of the loop heat pipe 1 of the first embodiment. FIG. 8A and FIG. 8B, and FIG. 9A and FIG. 9B are cross-sections corresponding to FIG. 3A and FIG. 3B, respectively. FIG. 10 is a cross-section corresponding to FIG. 3B.

First, in a step illustrated in FIG. 8A and FIG. 8B, a metal sheet is prepared, and the opening 32k that penetrates the metal sheet in a thickness direction (Z direction) is formed by processing the metal sheet. By forming the opening 32k, the wall portion 32a and the wall portion 32b, each having a long and narrow shape, which are apart from each other and substantially in parallel with each other while interposing the opening 32k therebetween, are formed. The opening 32k becomes a part of the flow path 50. The opening 32k may be formed by, for example, pressing or etching.

After forming the opening 32k, the concave drawing lines 32x are formed in the wall portion 32a, and the concave drawing lines 32y are formed in the wall portion 32b to complete the metal layer 32. Specifically, a resist layer (a photosensitive dry film resist or the like) including opening portions to expose portions where the drawing lines 32x are formed is formed on the wall portion 32a. Similarly, a resist layer including opening portions to expose portions where the drawing lines 32y are formed is formed on the wall portion 32b. Then, by using the resist layers as masks, the wall portion 32a and the wall portion 32b that are exposed in the opening portions are half-etched and the concave drawing lines 32x are formed in the wall portion 32a, and the concave drawing lines 32y are formed in the wall portion 32b. Thereafter, the resist layers are removed by stripping solution. The amount of half-etching may be, for example, approximately half of the thickness of the metal sheet. When the metal sheet is made of copper, for example, ferric chloride solution may be used for the half-etching.

Further, although not illustrated in the drawings, another metal sheet is prepared, and similar to the metal layer 32, the metal sheet is processed to form the opening 35k that penetrates the metal sheet in a thickness direction (Z direction). By forming the opening 35k, the wall portion 35a and the wall portion 35b, each having a long and narrow shape, which are apart from each other and substantially in parallel with each other while interposing the opening 35k therebetween, are formed (not illustrated in the drawings). Then, after forming the opening 35k, similar to the metal layer 32, each of the wall portion 35a and the wall portion 35b is selectively half-etched and the concave drawing lines 35x are formed in the wall portion 35a, and the concave drawing lines 35y are formed in the wall portion 35b to complete the metal layer 35 (not illustrated in the drawings). The material and the thickness of each of the metal layers, and the shape and the size of each of the drawing lines are as described above.

Next, in a step illustrated in FIG. 9A and FIG. 9B, a metal sheet is prepared, and the opening 33k that penetrates the metal sheet in a thickness direction (Z direction) is formed by processing the metal sheet. By forming the opening 33k, the wall portion 33a and the wall portion 33b, each having a long and narrow shape, which are apart from each other and substantially in parallel with each other while interposing the opening 33k there between, are formed. The opening 33k becomes a part of the flow path 50. Similar to the case of forming the opening 32k in the metal layer 32, the opening 33k may be formed by, for example, pressing or etching.

After forming the opening 33k, the concave drain line 33x are formed in the wall portion 33a, and the concave drain lines 33y are formed in the wall portion 33b to complete the metal layer 33. Specifically, a resist layer (a photosensitive dry film resist or the like) including an opening portion to expose a portion where the drain line 33x is formed is formed on the wall portion 33a. Similarly, a resist layer including an opening portion to expose a portion where the drain line 33y is formed is formed on the wall portion 33b. Then, by using the resist layers as masks, the wall portion 33a and the wall portion 33b exposed in the opening portions are half-etched and the concave drain line 33x is formed in the wall portion 33a, and the concave drain line 33y is formed in the wall portion 33b. Thereafter, the resist layers are removed by stripping solution. The amount of half-etching may be, for example, approximately half of the thickness of the metal sheet. When the metal sheet is made of copper, for example, ferric chloride solution may be used for the half-etching.

Further, although not illustrated in the drawings, another metal sheet is prepared, and similar to the metal layer 33, the metal sheet is processed to form the opening 34k that penetrates the metal sheet in a thickness direction (Z direction). By forming the opening 34k, the wall portion 34a and the wall portion 34b, each having a long and narrow shape, which are apart from each other and substantially in parallel with each other while interposing the opening 34k therebetween, are formed (not illustrated in the drawings). Then, after forming the opening 34k, similar to the metal layer 33, each of the wall portion 34a and the wall portion 34b is selectively half-etched and the concave drain line 34x is formed in the wall portion 34a, and the concave drain line 34y is formed in the wall portion 34b to complete the metal layer 34 (not illustrated in the drawings). The material and the thickness of each of the metal layers, and the shape and the size of each of the drain lines are as described above.

Next, in a step illustrated in FIG. 10, the metal layers 31 and 36, each of which is a solid metal layer in which pores and grooves are not formed, are prepared. Then, as illustrated in FIG. 10, the metal layers 31 to 36 are stacked. Specifically, the metal layer 31 and the metal layer 36 are provided as outermost layers. Then, the metal layers 32 to 35 are stacked between the outermost metal layers 31 and 36. The metal layers 32 to 35 are stacked such that one end of each of the drawing lines overlaps the respective drain line at least at a part to be in communication with each other. In FIG. 10, the metal layer 32 and the metal layer 33 are stacked such that the drawing lines 32x and 32y of the metal layer 32 and the drain lines 33x and 33y of the metal layer 33 are facing with each other, respectively, and one end of each of the drawing lines 32x and 32y overlaps the respective drain line 33x or 33y at least at a part. Similarly, the metal layer 35 and the metal layer 34 are stacked such that the drawing lines 35x and 35y of the metal layer 35 and the drain lines 34x and 34y of the metal layer 34 are facing with each other, respectively, and one end of each of the drawing lines 35x and 35y overlaps the respective drain line 34x or 34y at least at a part.

Next, a solid-phase welding is performed by pressing and heating on a structure body in which the metal layers 32 to 35 are stacked between the outermost metal layers 31 and 36. With this, adjacent metal layers are directly bonded, and the loop heat pipe 1 including the evaporator 10, the condenser 20, the vapor line 30 and the liquid line 40 is completed. At this time, the flow path 50 as illustrated in FIG. 10 and the like is formed in each of the condenser 20 and the vapor line 30, by the openings 32k, 33k, 34k and 35k provided in the intermediate metal layer 45 (metal layers 32 to 35), the wall portions of the intermediate metal layer 45 which are apart from each other by interposing the openings 32k, 33k, 34k and 35k there between, and the two outermost metal layers (metal layers 31 and 36). Then, a predetermined drain line and predetermined drawing lines are in communication with each other in the intermediate metal layer 45. Thereafter, after evacuating the liquid line 40 using a vacuum pump or the like, the working fluid C is introduced from an inlet, not illustrated in the drawings, into the liquid line 40 and the inlet is sealed.

Here, solid-phase welding is a method of bonding objects, by heating the objects under solid phase (solid) states to be softened without melting them, and further applying pressure to bond the objects by plastic deformation. Here, it is preferable that the entire materials of the metal layers 31 to 36 are the same so that the adjacent metal layers can be appropriately bonded by the solid-phase welding.

Further, as long as the metal layers 32 to 35 are stacked such that one end of each of the drawing lines overlaps one of the drain lines at least at a part to be in communication with each other, stacking order of the metal layers 32 to 35 of the intermediate metal layer 45 is not specifically limited.

Second Embodiment

In a second embodiment, an example is described in which the number of the drain lines and the drawing lines are increased by providing a partition portion in the intermediate metal layer. In the second embodiment, the same components are given the same reference numerals as the above described embodiment, and explanations are not repeated.

Figure 11B:
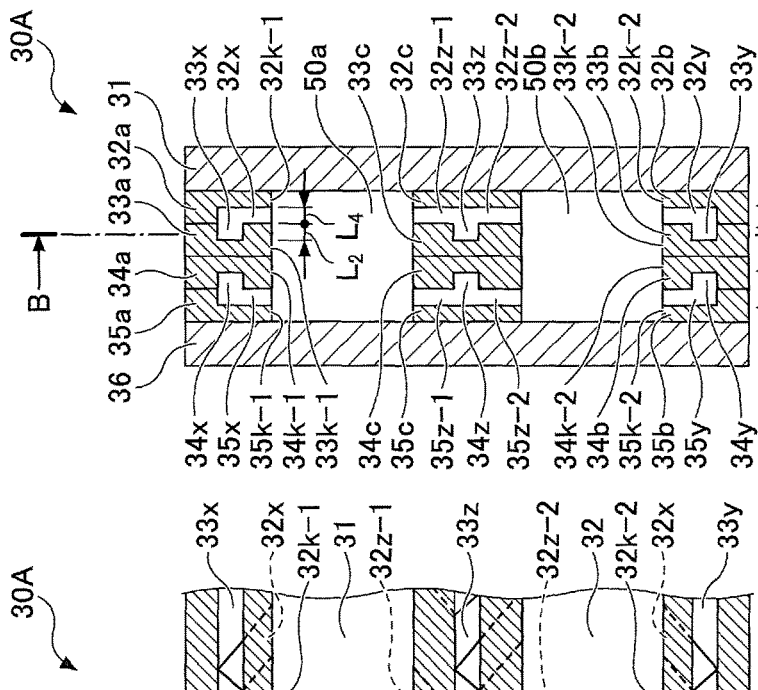
FIG. 11A and FIG. 11B are cross-sectional views illustrating an example of a structure of a vapor line of a loop heat pipe of a second embodiment.
Figure 11A:
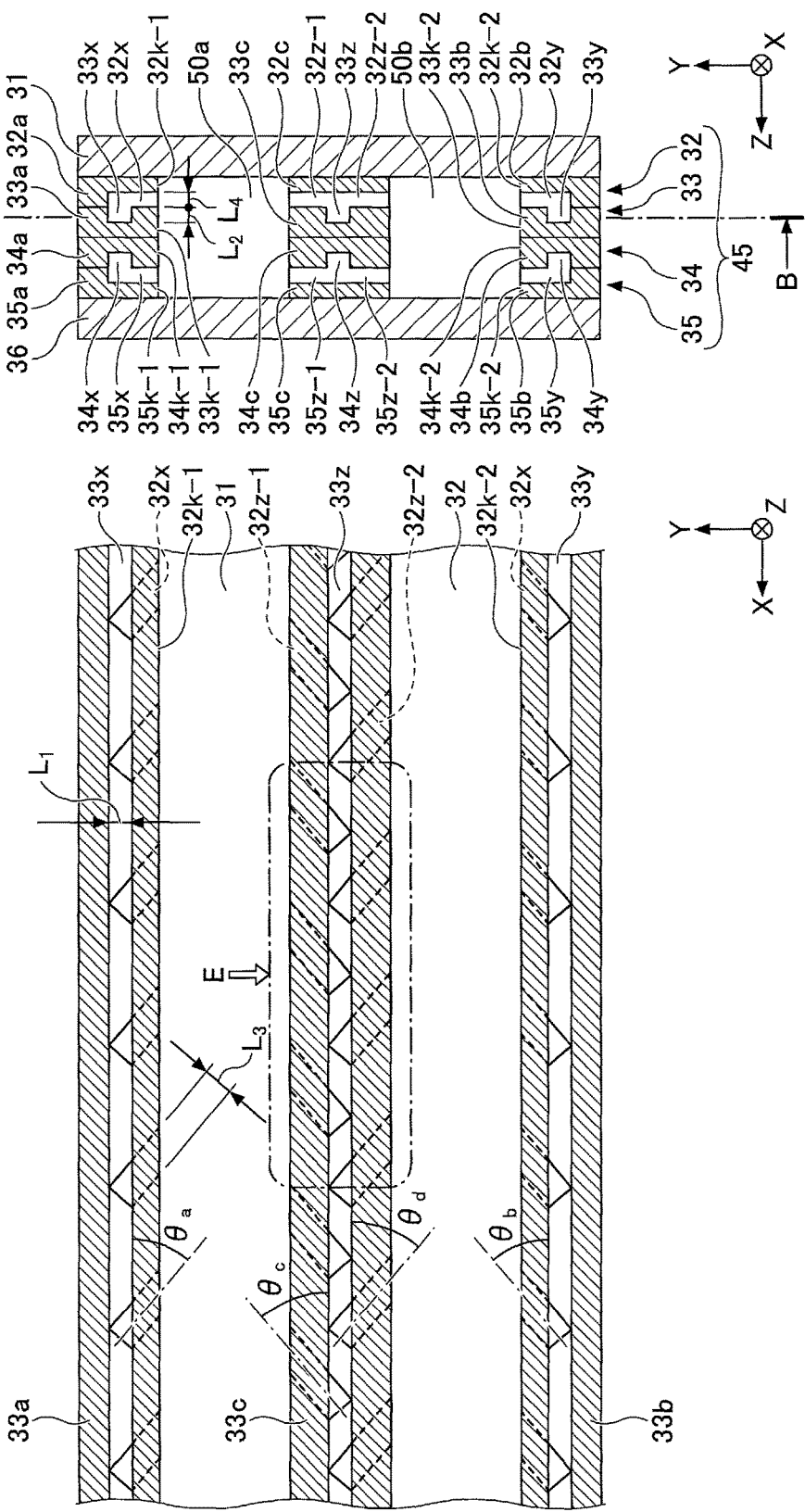
Figure 12:
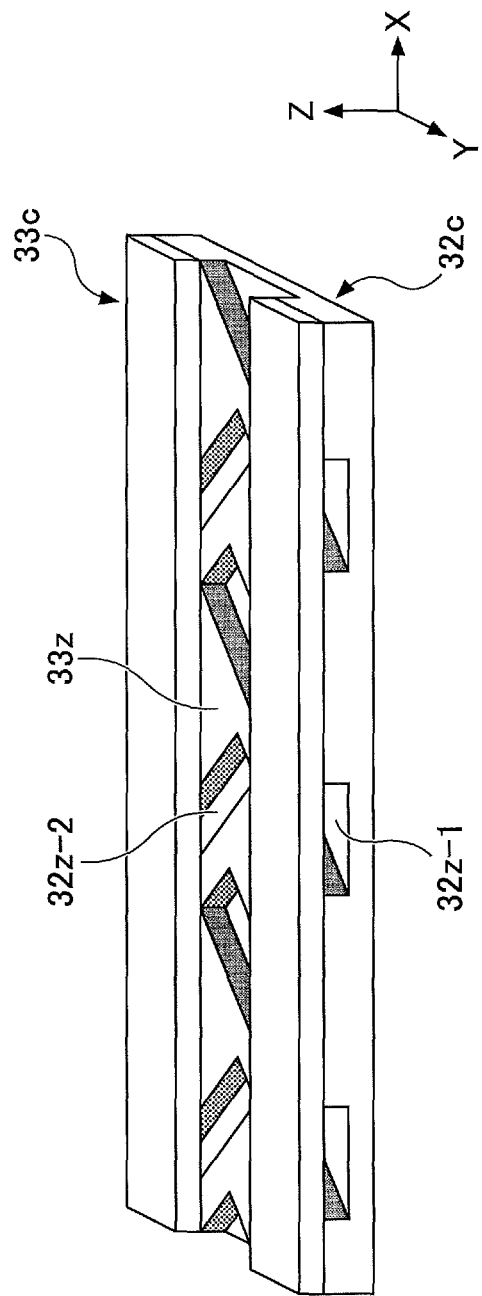
FIG. 12 is a partial perspective view illustrating an example of a structure of the vapor line of the loop heat pipe of the second embodiment.

FIG. 11A and FIG. 11B are cross-sectional views illustrating an example of a structure of a vapor line 30A of a loop heat pipe of the second embodiment. FIG. 11A and FIG. 11B are cross-sections corresponding to FIG. 3A and FIG. 3B. FIG. 12 is a partial perspective view illustrating an example of a structure of the vapor line 30A of the loop heat pipe of the second embodiment, and is a partial perspective view illustrating a portion of FIG. 11A surrounded by a dashed line seen in a direction of an arrow E.

With reference to FIG. 11A to FIG. 12, in the vapor line 30A, a partition portion 32c is provided between the wall portion 32a and the wall portion 32b in the Y direction of the metal layer 32. The partition portion 32c is formed to be apart from the wall portion 32a and the wall portion 32b substantially in parallel while interposing a predetermined opening 32k-1 and an opening 32k-2, therebetween, respectively. The opening 32k-1 and the opening 32k-2 are, for example, formed to expose a part of each of the metal layers 31 and 36 therein.

Similarly, in the Y direction of the metal layer 33, a partition portion 33c is provided between the wall portion 33a and the wall portion 33b. The partition portion 33c is formed to be apart from the wall portion 33a and the wall portion 33b substantially in parallel while interposing a predetermined opening 33k-1 and an opening 33k-2, therebetween, respectively. The partition portion 33c is, for example, formed to stack on the partition portion 32c. The opening 33k-1 and the opening 33k-2 are, for example, formed to communicate with the opening 32k-1 and the opening 32k-2, respectively, to expose a part of each of the metal layers 31 and 36 therein.

Similarly, in the Y direction of the metal layer 34, a partition portion 34c is provided between the wall portion 34a and the wall portion 34b. The partition portion 34c is formed to be apart from the wall portion 34a and the wall portion 34b substantially in parallel with each other while interposing a predetermined opening 34k-1 and an opening 34k-2, therebetween, respectively. The partition portion 34c is, for example, formed to stack on the partition portion 33c. The opening 34k-1 and the opening 34k-2 are, for example, formed to communicate with the opening 33k-1 and the opening 33k-2, respectively, to expose a part of each of the metal layers 31 and 36 therein.

Similarly, in the Y direction of the metal layer 35, a partition portion 35c is provided between the wall portion 35a and the wall portion 35b. The partition portion 35c is formed to be apparat from the wall portion 35a and the wall portion 35b substantially in parallel with each other while interposing a predetermined opening 35k-1 and an opening 35k-2, therebetween, respectively. The opening 35k-1 and the opening 35k-2 are, for example, formed to expose a part of each of the metal layers 31 and 36 therein. The partition portion 35c is, for example, formed to stack on the partition portion 34c. Further, the opening 35k-1 and the opening 35k-2 are, for example, formed to communicate with the opening 34k-1 and the opening 34k-2, respectively. Thus, an opening formed by the openings 32k-1 to 35k-1 and an opening formed by the openings 32k-2 to 35k-2 expose a part of the metal layers 31 and 36 therein, respectively.

A plurality of flow paths 50a and 50b, in each of which the vapor Cv flows, are formed by each of the openings 32k-1 to 35k-1 and each of the openings 32k-2 to 35k-2 formed in the metal layers 32 to 35, respectively, and the metal layers 31 and 36.

Specifically, the flow path 50a is formed by sandwiching the openings 32k-1 to 35k-1 sandwiched by the wall portions 32a, 33a, 34a and 35a and the partition portions 32c, 33c, 34c and 35c of the metal layers 32 to 35, respectively, from both sides by the metal layers 31 and 36. Similarly, the flow path 50b is formed by sandwiching the openings 32k-2 to 35k-2 sandwiched by the wall portions 32b, 33b, 34b and 35b and the partition portions 32c, 33c, 34c and 35c of the metal layers 32 to 35, respectively, from both sides by the metal layers 31 and 36.

Further, the partition portions 32c, 33c, 34c and 35c may function as a support for supporting the metal layer 31 and the metal layer 36.

As can be understood from FIG. 11A and FIG. 12, a drain line 33z is formed in the partition portion 33c of the metal layer 33 along the flow path 50a and the flow path 50b. The drain line 33z is not directly communicating with each of the flow paths 50a and 50b, and is separated and apart from (independently from) each of the flow paths 50a and 50b. Further, drawing lines 32z-1 and 32z-2 are provided in the partition portion 32c of the metal layer 32 for connecting the drain line 33z to the flow paths 50a and 50b, respectively.

Similarly, a drain line 34z is formed in the partition portion 34c of the metal layer 34 along the flow path 50a and the flow path 50b. The drain line 33z and the drain line 34z are provided to be substantially in parallel with each other. The drain line 34z is not directly communicating with each of the flow paths 50a and 50b, and is separated and apart from (independently from) each of the flow paths 50a and 50b. Further, drawing lines 35z-1 and 35z-2 are provided in the partition portion 35c of the metal layer 35 for connecting the drain line 34z to the flow paths 50a and 50b, respectively.

The drain line 33z is formed by a concave portion that is half-etched along the X direction of the flow paths 50a and 50b in the partition portion 33c of the metal layer 33. The drain line 33z is separated and apart from each of the flow paths 50a and 50b by sidewalls of the concave portion, respectively.

The drain line 34z is formed by a concave portion that is half-etched along the X direction of the flow paths 50a and 50b in the partition portion 34c of the metal layer 34. The drain line 34z is separated and apart from each of the flow paths 50a and 50b by sidewalls of the concave portion. The shape and the size of each of the drain lines 33z and 34z may be approximately the same as those of the drain line 33x or the like. As the metal layer 34 has a structure similar to that of the metal layer 33, an enlarged view of the metal layer 34 is not illustrated in the drawings.

The drawing lines 32z-1 are formed by concave portions that are half-etched in the partition portion 32c of the metal layer 32 at a predetermined interval in the X direction. Similarly, the drawing lines 32z-2 are formed by concave portions that are half-etched in the partition portion 32c of the metal layer 32 at predetermined interval in the X direction. Here, the drawing lines 32z-1 and the drawing lines 32z-2 are provided to be shifted from each other in the Y direction. In other words, the drawing lines 32z-1 are provided at one side of the partition portion 32c in the Y direction, while the drawing lines 32z-2 are provided at the other side of the partition portion 32c in the Y direction. The drawing lines 32z-1 and the drawing lines 32z-2 of the metal layer 32 are alternately provided along the X direction of the drain line 33z.

Similarly, the drawing lines 35z-1 are formed by concave portions that are half-etched in the partition portion 35c of the metal layer 35 at a predetermined interval in the X direction. Similarly, the drawing lines 35z-2 are formed by concave portions that are half-etched in the partition portion 35c of the metal layer 35 at a predetermined interval in the X direction. Here, the drawing lines 35z-1 and the drawing lines 35z-2 are provided to be shifted from each other in the Y direction. The drawing lines 35z-1 and the drawing lines 35z-2 of the metal layer 35 are alternately provided along the X direction of the drain line 34z. As the metal layer 35 has a structure similar to that of the metal layer 32, an enlarged view of the metal layer 35 is not illustrated in the drawings.

Each of the drawing lines 32z-1 and the drawing lines 32z-2 is provided to be inclined with respect to the drain line 33z in the partition portion 32c. Each of an angle θc between the drawing line 32z-1 and the drain line 33z, and an angle θd between the drawing line 32z-2 and drain line 33z, in the flowing direction of the vapor Cv, may be, for example, a sharp angle, approximately 45°. Here, the angle θc and the angle θd are not necessarily the same angle.

Similarly, each of the drawing lines 35z-1 and the drawing lines 35z-2 is provided to be inclined with respect to the drain line 34z in the partition portion 35c. Then, an angle between drawing line 35z-1 at one side and the drain line 34z, and an angle between the drawing line 35z-2 at the other side and the drain line 34z may be approximately the same as the angles θc and θd, respectively. The shape and the size of each of the drawing lines 32z-1 and the drawing lines 32z-2, and the shape and the size of each of the drawing lines 35z-1 and the drawing lines 35z-2 may be approximately the same as those of the drawing lines 32x or the like.

By stacking the metal layer 32 and the metal layer 33, one end of each of the drawing lines 32z-1 at a drain line 33z side communicates with the drain line 33z, and the other end of each of the drawing lines 32z-1, opposite from the drain line 33z, communicates with the flow path 50a. Similarly, one end of each of the drawing lines 32z-2 at the drain line 33z side communicates with the drain line 33z, and the other end of each of the drawing lines 32z-2, opposite from the drain line 33z, communicates with the flow path 50b.

Similarly, by stacking the metal layer 34 and the metal layer 35, one end of each of the drawing lines 35z-1 at a drain line 34z side communicates with the drain line 34z, and the other end of each of the drawing lines 35z-1, opposite from the drain line 34z, communicates with the flow path 50a. Similarly, one end of each of the drawing lines 35z-2 at the drain line 34z side communicates with the drain line 34z, and the other end of each of the drawing lines 35z-2, opposite from the drain line 34z, communicates with the flow path 50b.

According to the second embodiment, it is assumed that the vapor Cv generated in the evaporator 10 (FIG. 1) moves in the vapor line 30A in a direction of an arrow (X direction) of FIG. 13A toward the condenser 20 and the liquid line 40. At this time, even when the vapor Cv is dew condensed in the vapor line 30A and water drops WD are generated, the water drops WD are drawn to the drain lines 33x, 33y, 33z, 34x, 34y and 34z via the drawing lines 32x, 32y, 32z-1 and 32z-2, 35x, 35y and 35z-1 and 35z-2, respectively, by capillary attraction.

In the vapor line 30A, compared with the vapor line 30, as the drain lines 33z and 34z, and the drawing lines 32z-1, 32z-2, 35z-1, 35z-2 are additionally formed, capillary attraction by the drain lines can be improved, and it is possible to furthermore easily draw the water drops WD in the vapor line 30A. With this, the water drops WD hardly stay in the vapor line 30A, and the water drops WD can be furthermore prevented from being formed into a large drop. As a result, as the water drops WD do not block the flow of the vapor Cv, the vapor Cv can easily move, and heat transfer efficiency can be furthermore improved.

Third Embodiment

In a third embodiment, an example in which the shape of the drain line is different from that of the first embodiment is described. In the third embodiment, the same components are given the same reference numerals as the above described embodiments, and explanations are not repeated.

Figure 14B:
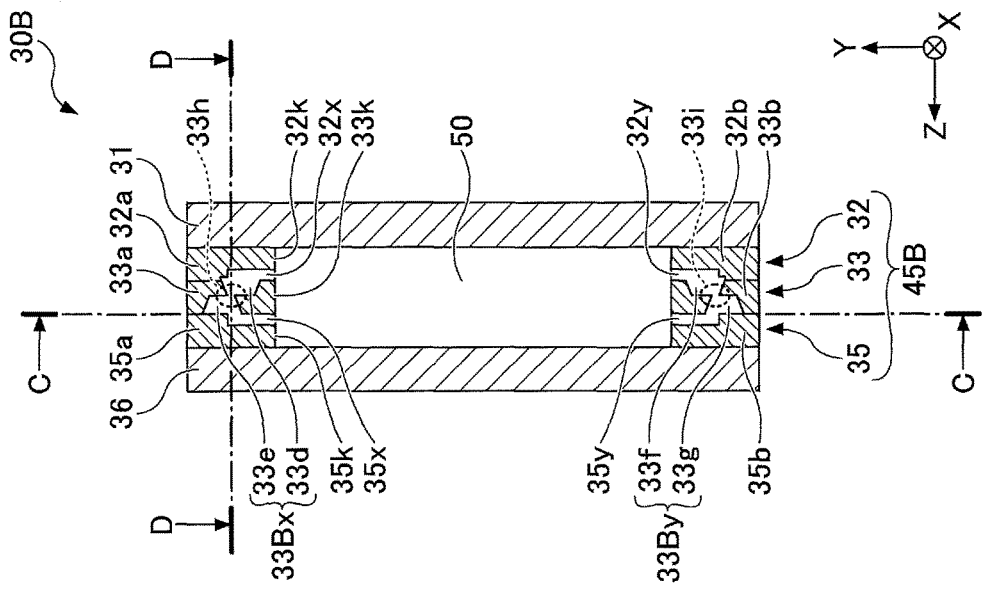
FIG. 14A and FIG. 14B are cross-sectional views (No. 1) illustrating an example of a structure of a vapor line of a loop heat pipe of a third embodiment.
Figure 14A:
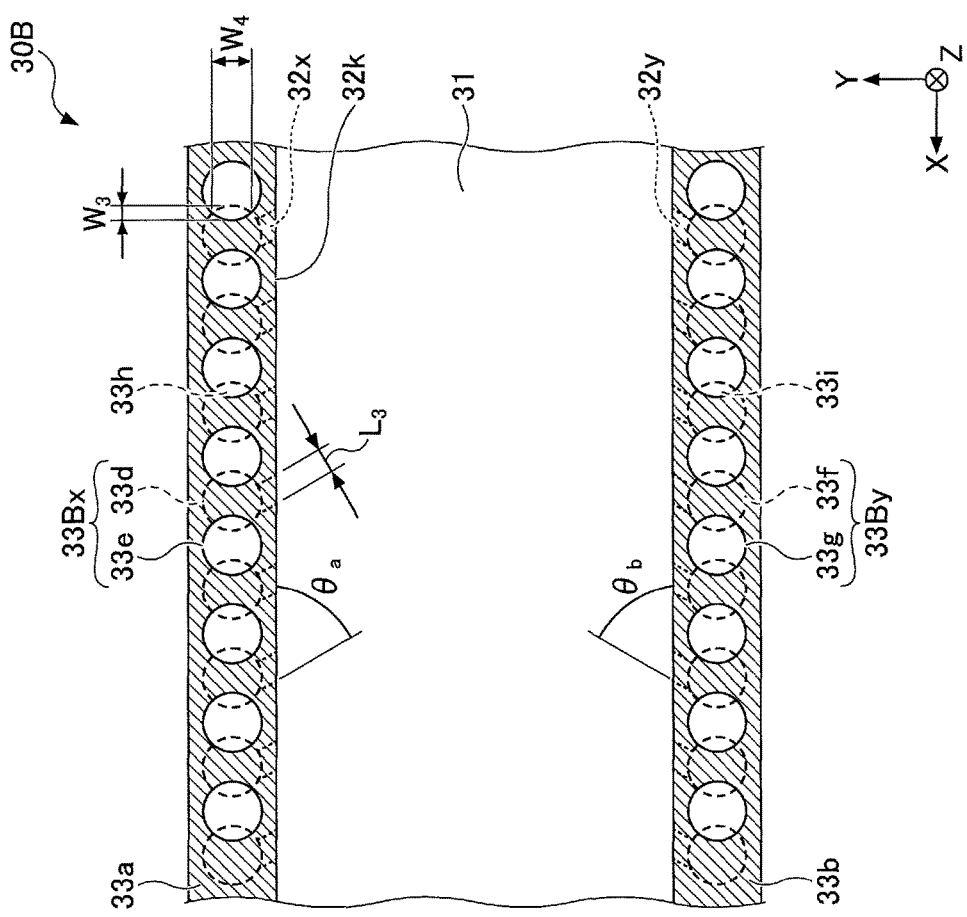
Figure 15:
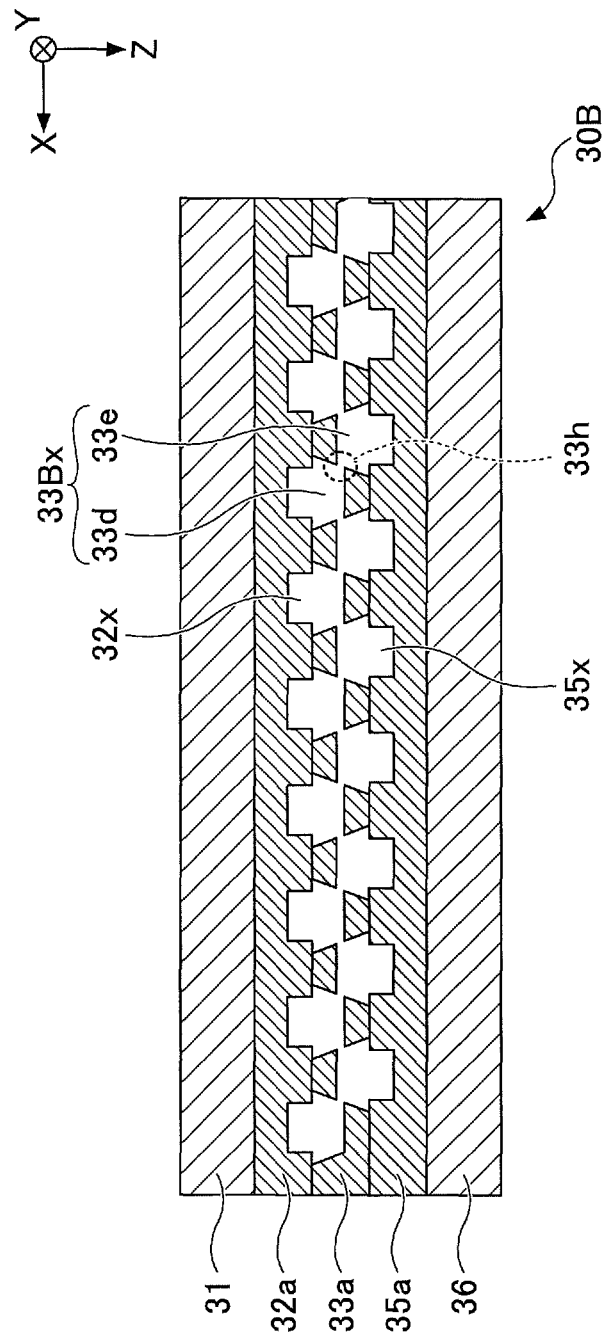
FIG. 15 is a cross-sectional view (No. 2) illustrating an example of a structure of the vapor line of the loop heat pipe of the third embodiment.

FIG. 14A and FIG. 14B are cross-sectional views illustrating an example of a structure of a vapor line 30B of a loop heat pipe of a third embodiment. FIG. 14B illustrates a cross-section along the A-A line of FIG. 1. FIG. 14A is a cross-section along a C-C line of FIG. 14B. FIG. 15 is a cross-section along a D-D line of FIG. 14B.

With reference to FIG. 14A to FIG. 15, in the vapor line 30B, an intermediate metal layer 45B is formed by three layers of the metal layers 32, 33 and 35. The structure of each of the metal layers 31, 32, 35 and 36 may be the same as that of the vapor line 30.

In the wall portions 33a and 33b of the metal layer 33, drain lines 33Bx and 33By are respectively provided along the flow path 50 substantially in parallel with each other. Each of the drain lines 33Bx and 33By is not directly communicating with the flow path 50 and is separated and apart from (independently from) the flow path 50.

In the wall portion 33a of the metal layer 33, a plurality of bottomed holes 33d and a plurality of bottomed holes 33e are formed. Each of the bottomed holes 33d is formed to concave from a metal layer 32 side to a substantially center portion of the wall portion 33a in the thickness direction, and each of the bottomed holes 33e is formed to concave from a metal layer 35 side to a substantially center portion of the wall portion 33a in the thickness direction. The bottomed holes 33d and 33e may be formed by half-etching the wall portion 33a of the metal layer 33 from one surface and from the other surface.

The bottomed holes 33d and the bottomed holes 33e are alternately provided in the X direction, in a planar view (seen in the Z direction, the same in the following as well). Each of the bottomed holes 33d and each of the bottomed holes 33e that are alternately provided and adjacent to each other in the X direction partially overlap in a planar view, and overlapping portions are communicating with each other to form a pore 33h. The adjacent bottomed hole 33d and the bottomed hole 33e are continuously connected via the pore 33h to form the drain line 33Bx. The drain line 33Bx is separated and apart from the flow path 50 by sidewalls of the bottomed hole 33d and the bottomed hole 33e.

Similarly, in the wall portion 33b of the metal layer 33, a plurality of bottomed holes 33f and a plurality of bottomed holes 33g are formed. Each of the bottomed holes 33f is formed to concave from the metal layer 32 side to a substantially center portion of the wall portion 33b in the thickness direction, and each of the bottomed holes 33g is formed to concave from the metal layer 35 side to a substantially center portion of the wall portion 33b in the thickness direction. The bottomed holes 33f and 33g may be formed by half-etching the wall portion 33b of the metal layer 33 from the one surface and the other surface.

The bottomed holes 33f and the bottomed holes 33g are alternately provided in the X direction, in a planar view. Each of the bottomed holes 33f and each of the bottomed holes 33g that are alternately provided and adjacent to each other in the X direction partially overlap in a planar view, and overlapping portions are communicating with each other to form a pore 33i. The adjacent bottomed hole 33f and the bottomed hole 33g are continuously connected via the pore 33i to form the drain line 33By. The drain line 33By is separated and apart from the flow path 50 by sidewalls of the bottomed hole 33f and the bottomed hole 33g.

One end of each of the drawing lines 32x communicates with the respective bottomed hole 33d, and the other end of each of the drawing lines 32x communicates with the flow path 50. Similarly, one end of each of the drawing lines 32y communicates with the respective bottomed hole 33f, and the other end of each of the drawing lines 32y communicates with the flow path 50. Similarly, one end of each of the drawing lines 35x communicates with the respective bottomed hole 33e, and the other end of each of the drawing lines 35x communicates with the flow path 50. Similarly, one end of each of the drawing lines 35y communicates with the respective bottomed hole 33g, the other end of each of the drawing lines 35y communicates with the flow path 50.

Each of the bottomed holes 33d and 33e may be, for example, a circle whose diameter is approximately 100 to 300 μm, but may have any shapes such as an elliptical shape or a polygonal shape. The depth of each of the bottomed holes 33d and 33e may be, for example, approximately half of the thickness of the metal layer 33. A space between the adjacent bottomed holes 33d may be, for example, approximately 100 to 400 μm. A space between the adjacent bottomed holes 33e may be, for example, approximately 100 to 400 μm.

An inner wall of each of the bottomed holes 33d and 33e may be formed in a tapered shape whose width becomes larger from a bottom surface side to an open portion side. However, this is not limited so, and the inner wall of each of the bottomed holes 33d and 33e may be perpendicular to the bottom surface. A width $W_3$ of the pore 33h in the X direction may be, for example, approximately 10 to 50 μm. A width $W_4$ of the pore 33h in the Y direction may be, for example, approximately 50 to 150 μm.

The shape, the size, the interval of the bottomed holes 33f and 33g may be approximately the same as those of the bottomed holes 33d and 33e. The size of the pore 33i may be approximately the same as that of the pore 33h.

The width $L_3$ of each of the drawing lines 32x and 32y in a direction perpendicular to the inclined direction may be approximately the same as the diameter of the bottomed hole 33d, or may be smaller than the diameter of the bottomed hole 33d. A communication portion between the drawing line 32x and the bottomed hole 33d, and a communication portion between the drawing line 32y and the bottomed hole 33f may be shifted as illustrated FIG. 14B, or may be matched. This is the same for the relationships between the drawing lines 35x and 35y and the bottomed holes 33e and 33g, respectively.

As such, by providing the pores 33h in each of which the bottomed hole 33d and the bottomed hole 33e are communicating with each other in the drain line 33Bx, capillary attraction of the drain line 33Bx can be improved, and water drops generated in the vapor line 30B can be easily drawn into the drain line 33Bx. Similarly, by providing the pores 33i in each of which the bottomed hole 33f and the bottomed hole 33g are communicating with each other in the drain line 33By, capillary attraction of the drain line 33By can be improved, and water drops generated in the vapor line 30B can be easily drawn into the drain line 33By.

Further, by forming the width of each of the drawing lines 32x and 35x to be smaller than the diameter of each of the bottomed holes 33d and 33e, and also shifting the communicating portions between the drawing lines 32x and 35x and the bottomed holes 33d and 33e, respectively, capillary attraction can be furthermore improved. Thus, the water drops generated in the vapor line 30B can be more easily drawn into the drain line 33Bx. Similarly, by forming the width of each of the drawing lines 32y and 35y to be smaller than the diameter of each of the bottomed holes 33f and 33g, and also shifting the communicating portions between the drawing lines 32y and 35y and the bottomed holes 33f and 33g, respectively, capillary attraction can be furthermore improved. Thus, the water drops generated in the vapor line 30B can be more easily drawn into the drain line 33By.

Here, a partition portion similar to that of the second embodiment may be provided in the intermediate metal layer 45B, and drain lines similar to the drain lines 33Bx and 33By may be provided in the partition portion to furthermore improve capillary attraction. Further, capillary attraction may be furthermore improved by increasing the stacking number of the metal layer constituting the intermediate metal layer 45B and increasing the number of drain lines similar to the drain lines 33Bx and 33By.

According to the embodiments, a loop heat pipe capable of suppressing dew condensation in a vapor line and promoting condensation in a condenser is provided.

Although a preferred embodiment of the loop heat pipe has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

For example, although it is illustrated in FIG. 3A and FIG. 3B, an example in which the drain line and the drawing lines are provided in each of the wall portions 32a to 35a and the wall portions 32b to 35b of the metal layers 32 to 35, respectively, the drain line and the drawing lines may be provided at one of the wall portions of each of the metal layers 32 to 35. Further, although it is illustrated in FIG. 3A and FIG. 3B, an example in which the plurality of the stacked bodies in each of which the metal layer in which the drain line is formed and the metal layer in which the drawing lines are formed are stacked are included in the intermediate metal layer, it is enough to include at least the single stacked body.

In other words, it is unnecessary to provide all of the combinations of the drain line 33x and the drawing lines 32x, the drain line 33y and the drawing lines 32y, the drain line 34x and the drawing lines 35x, and the drain line 34y and the drawing lines 35y illustrated in FIG. 3A and FIG. 3B, and at least one combination of the drain line and the drawing lines may be provided. This is the same for the structure illustrated in FIG. 11A and FIG. 11B.

Further, in FIG. 3A and FIG. 3B, only the four of the metal layers 31, 32, 33 and 36 may be provided, or only the four metal layers 31, 34, 35 and 36 may be provided. In this case as well, at least one combination of the drain line and the drawing lines may be provided. This is the same for the structure illustrated in FIG. 11A and FIG. 11B.

Further, a structure using a single metal layer in which the drain line and the drawing lines are provided in the single metal sheet by half-etching may be provided. In such a case, by stacking the metal layers 31 and 36 at both sides of the metal layer, a vapor line of a three-layered structure can be actualized. However, as described above, if the drain line and the drawing lines are provided in the same metal layer, intensity is lowered. Thus, in a case where a sufficient intensity is required, it is more preferable that a drain line and drawing lines are provided in the different metal layers, respectively, as illustrated in FIG. 3A and FIG. 3B, or in FIG. 11A and FIG. 11B.

Various aspects of the subject-matter described herein are set out non-exhaustively in the following numbered clause:

1. A method of manufacturing a loop heat pipe that includes
   an evaporator that vaporizes working fluid,
   a condenser that condenses the working fluid,
   a liquid line that connects the evaporator and the condenser, and
   a vapor line that connects the evaporator and the condenser,
   the evaporator, the vapor line, the liquid line and the condenser forming a flow path that is a loop through which the working fluid or vapor of the working fluid flows,
   in the condenser and the vapor line, wall portions of the flow path being constituted by a metal layer,
   the method comprising:
   a step of forming the metal layer, including
   by processing a metal sheet, forming an opening and the wall portions which are apart from each other while interposing the opening, in the metal sheet, and
   by half-etching the metal sheet, forming a drain line that is separated and apart from the opening and a drawing line that connects the drain line and the opening in at least one of the wall portions.

What is claimed is:

1. A loop heat pipe comprising:
   an evaporator that vaporizes working fluid;
   a condenser that condenses the working fluid;
   a liquid line that connects the evaporator and the condenser; and
   a vapor line that connects the evaporator and the condenser,
   wherein the evaporator, the vapor line, the liquid line and the condenser form a flow path that is a loop through which the working fluid or vapor of the working fluid flows,
   wherein in the condenser and the vapor line, a wall portion of the flow path is constituted by a metal layer,
   wherein a drain line formed to be separated and apart from the flow path is provided in the wall portion, and
   wherein a drawing conduit connecting the drain line and the flow path is provided inside the wall portion of the flow path.

2. The loop heat pipe according to claim 1,
   wherein the metal layer includes a stacked body configured with a first metal layer in which only the drain line is formed and a second metal layer in which only the drawing conduit is formed, and
   wherein one end of the drawing conduit communicates with the drain line and the other end of the drawing conduit communicates with the flow path.

3. The loop heat pipe according to claim 2, further comprising a plurality of the stacked bodies that are sequentially stacked.

4. The loop heat pipe according to claim 1,
   wherein the wall portion of the metal layer includes a first wall portion, and a second wall portion that is positioned opposite from the first wall portion while interposing an opening that is the flow path,
   wherein the drain line includes a first drain line formed in the first wall portion, and a second drain line formed in the second wall portion, and
   wherein the drawing conduit includes a first drawing conduit formed in the first wall portion, and a second drawing conduit formed in the second wall portion.

5. The loop heat pipe according to claim 4,
   wherein the metal layer includes a partition portion provided between the first wall portion and the second wall portion to form a first flow path surrounded by the first wall portion and the partition portion, and a second flow path surrounded by the second wall portion and the partition portion, and
   wherein in the partition portion, a third drain line that is separated and apart from the first flow path and the second flow path, a third drawing conduit connecting the third drain line and the first flow path and a fourth drawing conduit connecting the third drain line and the second flow path are provided.

6. The loop heat pipe according to claim 1, wherein an angle formed between the drawing conduit and the drain line is a sharp angle in a flowing direction of the vapor in the flow path.

7. The loop heat pipe according to claim 1,
   wherein the condenser and the vapor line includes a first outer metal layer and a second outer metal layer, provided at both outer sides, respectively, and
   wherein the metal layer that constitutes the wall portion of the flow path is an intermediate metal layer stacked between the first outer metal layer and the second outer metal layer, and
   wherein an opening that exposes a part of each of the first outer metal layer and the second outer metal layer to become the flow path is formed in the intermediate metal layer.

8. The loop heat pipe according to claim 1,
   wherein a plurality of the drawing conduits are provided in the wall portion,
   wherein the drain line is provided to extend along the flow path substantially in parallel with the flow path, and
   wherein the plurality of the drawing conduits are aligned along the flow path, and each of the plurality of drawing conduits is provided between the drain line and the flow path to connect the drain line and the flow path.

9. The loop heat pipe according to claim 1, wherein the drawing conduit and the drain line are configured to exert a capillary force to attract fluid drops from the flow path.

10. A loop heat pipe comprising:
    an evaporator that vaporizes working fluid;
    a condenser that condenses the working fluid;
    a liquid line that connects the evaporator and the condenser; and
    a vapor line that connects the evaporator and the condenser,
    wherein the evaporator, the vapor line, the liquid line and the condenser form a flow path that is a loop through which the working fluid or vapor of the working fluid flows,
    wherein in the condenser and the vapor line, a wall portion of the flow path is constituted by a metal layer,
    wherein a drain line formed to be separated and apart from the flow path is provided in the wall portion, and
    wherein a drawing line connecting the drain line and the flow path is provided in the wall portion,
    wherein in the wall portion, a plurality of first bottomed holes each of which is concaved from one side, a plurality of second bottomed holes each of which is concaved from the other side, and a plurality of pores each being formed by each of the first bottomed holes and each of the second bottomed holes that are adjacent to each other and partially communicating with each other are provided, and wherein the drain line is formed by the plurality of first bottomed holes, the plurality of second bottomed holes and the plurality of pores.

11. A loop heat pipe comprising:

an evaporator that vaporizes working fluid;

a condenser that condenses the working fluid;

a liquid line that connects the evaporator and the condenser; and a vapor line that connects the evaporator and the condenser, wherein the evaporator, the vapor line, the liquid line and the condenser form a flow path that is a loop through which the working fluid or vapor of the working fluid flows, wherein in the condenser and the vapor line, a wall portion of the flow path is constituted by a metal layer, wherein a drain line formed to be separated and apart from the flow path is provided in the wall portion, and wherein a drawing line connecting the drain line and the flow path is provided in the wall portion, wherein a plurality of the drawing lines are provided in the wall portion, wherein the drain line is provided to extend along the flow path substantially in parallel with the flow path, wherein each of the drawing lines is provided to be inclined with respect to an extending direction of the drain line, and wherein the plurality of the drawing lines are aligned along the flow path.

12. The loop heat pipe according to claim 11, wherein an angle formed between the drawing line and the drain line is a sharp angle in a flowing direction of the vapor in the flow path.

* * * * *